US012765123B2

(12) United States Patent
Lee et al.

(10) Patent No.: US 12,765,123 B2
(45) Date of Patent: Oct. 13, 2026

(54) LIGHT EMITTING ELEMENT AND DISPLAY DEVICE

(71) Applicant: Samsung Display Co., LTD., Yongin-si (KR)

(72) Inventors: Jong Won Lee, Yongin-si (KR); Bong Chun Park, Yongin-si (KR); Kwan Jae Lee, Yongin-si (KR); So Young Lee, Yongin-si (KR); Jin Hyuk Jang, Yongin-si (KR); Chan Woo Joo, Yongin-si (KR); Seon Hong Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 489 days.

(21) Appl. No.: 18/111,032

(22) Filed: Feb. 17, 2023

(65) Prior Publication Data

US 2023/0395744 A1 Dec. 7, 2023

(30) Foreign Application Priority Data

Jun. 3, 2022 (KR) ........................ 10-2022-0068406

(51) Int. Cl.

| | |
|---|---|
| ***H10H 20/813*** | (2025.01) |
| ***H10H 20/81*** | (2025.01) |
| ***H10H 20/857*** | (2025.01) |
| ***H10W 90/00*** | (2026.01) |

(52) U.S. Cl.

CPC ...... *H10H 20/8215* (2025.01); *H10H 20/857* (2025.01); *H10W 90/00* (2026.01)

(58) Field of Classification Search

CPC .. H10H 20/813; H10H 20/818; H10H 20/825; H10H 29/142

See application file for complete search history.

(56) References Cited

U.S. PATENT DOCUMENTS

| | | | | |
|---|---|---|---|---|
| 9,070,805 B2 | 6/2015 | Fudeta et al. | | |
| 12,095,008 B2 | 9/2024 | Sim et al. | | |
| 2015/0207035 A1* | 7/2015 | Tsai | H10H 20/811 | 257/76 |

(Continued)

FOREIGN PATENT DOCUMENTS

| | | |
|---|---|---|
| JP | 2013-012683 A | 1/2013 |
| KR | 10-2014-0099619 A | 8/2014 |

(Continued)

OTHER PUBLICATIONS

Korean Notice of Allowance for KR Application No. 10-2022-0068406, dated Jul. 6, 2026, 7 pages.

*Primary Examiner* — Ismail A Muse

(74) *Attorney, Agent, or Firm* — Womble Bond Dickinson (US) LLP

(57) ABSTRACT

A light emitting element may include a first semiconductor layer, a second semiconductor layer including a first area, a second area, and a third area that have different doping concentrations, an active layer disposed between the first semiconductor layer and the second semiconductor layer, and a first intermediate layer and a second intermediate layer that are disposed between at least one of the first area, the second area, and the third area. The first intermediate layer and the second intermediate layer may include different materials.

16 Claims, 16 Drawing Sheets

(56) References Cited

U.S. PATENT DOCUMENTS

| | | | | |
|---|---|---|---|---|
| 2016/0013376 | A1* | 1/2016 | Maki | H10H 20/854 438/26 |
| 2019/0013437 | A1* | 1/2019 | Han | H10H 20/811 |
| 2019/0067521 | A1* | 2/2019 | Takano | H10H 20/831 |
| 2022/0077350 | A1 | 3/2022 | Lee et al. | |

FOREIGN PATENT DOCUMENTS

| | | |
|---|---|---|
| KR | 10-2016-0043751 | 4/2016 |
| KR | 10-2017-0037596 | 4/2017 |
| KR | 10-2021-0032618 | 3/2021 |
| KR | 10-2022-0060049 A | 5/2022 |

* cited by examiner

LIGHT EMITTING ELEMENT AND DISPLAY DEVICE

CROSS-REFERENCE TO RELATED APPLICATION(S)

This application claims priority to and benefits of Korean patent application number 10-2022-0068406 under 35 U.S.C. § 119, filed on Jun. 3, 2022 in the Korean Intellectual Property Office, the entire contents of which are incorporated herein reference.

BACKGROUND

1. Technical Field

Various embodiments of the disclosure relate to a light emitting element and a display device.

2. Description of Related Art

Recently, as interest in information display increases, research and development on display devices has been continuously conducted.

SUMMARY

Various embodiments of the disclosure are directed to a light emitting element having improved alignment, and a display device including such a light emitting element.

Aspects of the disclosure are not limited to the above-stated aspects, and those skilled in the art will clearly understand other not mentioned aspects from the accompanying disclosure.

An embodiment of the disclosure may provide a light emitting element that may include a first semiconductor layer, a second semiconductor layer including a first area, a second area, and a third area that have different doping concentrations, an active layer disposed between the first semiconductor layer and the second semiconductor layer, and a first intermediate layer and a second intermediate layer that are disposed between at least one of the first area, the second area, and the third area. The first intermediate layer and the second intermediate layer may include different materials.

The first intermediate layer may be disposed between the first area and the second area. The second intermediate layer may be disposed between the second area and the third area.

The first intermediate layer and the second intermediate layer may be disposed between the first area and the second area.

The first intermediate layer and the second intermediate layer may be disposed between the second area and the third area.

A doping concentration of the second area may be greater than a doping concentration of the first area and less than a doping concentration of the third area.

The second area may be disposed between the first area and the third area.

The first layer may be disposed between the active layer and the second area.

The first intermediate layer and the second intermediate layer each may include at least one of AlGaN, GaN, AlGaInN, AlN, SiN, $Si_3N_4$, and BN.

An embodiment of the disclosure may provide a display device that may include a first electrode and a second electrode that may be spaced apart from each other, and light emitting elements disposed between the first electrode and the second electrode. Each of the light emitting elements may include a first semiconductor layer, a second semiconductor layer including a first area, a second area, and a third area that have different doping concentrations, an active layer disposed between the first semiconductor layer and the second semiconductor layer, and a first intermediate layer and a second intermediate layer that are disposed between at least one of the first area, the second area, and the third area. The first intermediate layer and the second intermediate layer may include different materials.

The first electrode may overlap the first semiconductor layer. The second electrode may overlap the second semiconductor layer.

The display device may further include a first connection electrode and a second connection electrode that may be disposed on the light emitting elements.

The first connection electrode may electrically contact the first semiconductor layer. The second connection electrode may electrically contact the second semiconductor layer.

The first connection electrode may be electrically connected to the first electrode. The second connection electrode may be electrically connected to the second electrode.

The first intermediate layer may be disposed between the first area and the second area. The second intermediate layer may be disposed between the second area and the third area.

The first intermediate layer and the second intermediate layer may be disposed between the first area and the second area.

The first intermediate layer and the second intermediate layer may be disposed between the second area and the third area.

A doping concentration of the second area may be greater than a doping concentration of the first area and less than a doping concentration of the third area.

The second area may be disposed between the first area and the third area.

The first area may be disposed between the active layer and the second area.

The first intermediate layer and the second intermediate layer each may include at least one of AlGaN, GaN, AlGaInN, AlN, SiN, $Si_3N_4$, and BN.

Details of various embodiments are included in the detailed description and drawings.

DETAILED DESCRIPTION OF THE EMBODIMENTS

Figure 1:
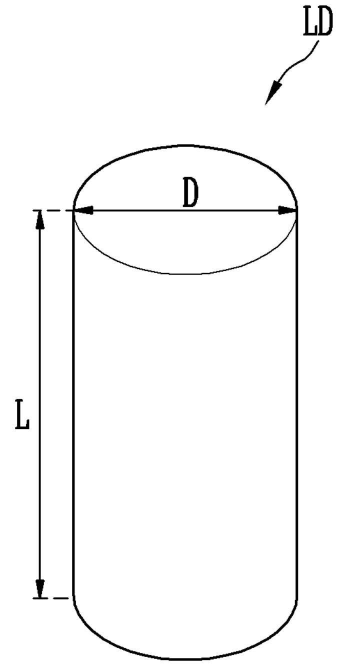
FIG. 1 is a schematic perspective view illustrating a light emitting element in accordance with an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well, unless the context clearly indicates otherwise.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean any combination including "A, B, or A and B."

Furthermore, the term "coupling" or "connection" may refer to physical and/or electrical coupling or connection. In addition, the term "coupling" or "connection" may refer to direct or indirect coupling or connection and integral or non-integral coupling or connection.

It will be understood that when an element or a layer is referred to as being "on" another element or a layer, it can be directly on, connected to, or coupled to the other element or the layer, or one or more intervening elements or layers may be present. Like reference numerals refer to like elements throughout.

It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the disclosure.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic perspective view illustrating a light emitting element LD in accordance with an embodiment. FIGS. 2 to 6 are schematic sectional views each illustrating a light emitting element LD in accordance with an embodiment. Although FIGS. 1 to 6 illustrate a pillar-type light emitting element LD, the type and/or shape of the light emitting element LD is not limited thereto.

Referring to FIGS. 1 to 6, the light emitting element LD may include a first semiconductor layer 11, an active layer 12, a second semiconductor layer 13, and/or an intermediate layer 14.

The light emitting element LD may be provided in the form of a pillar extending in a direction. The light emitting element LD may include a first end EP1 and a second end EP2. One of the first and second semiconductor layers 11 and 13 may be disposed on the first end EP1 of the light emitting element LD. The other one of the first and second semiconductor layers 11 and 13 may be disposed on the second end EP2 of the light emitting element LD. For example, the first semiconductor layer 11 may be disposed on the first end EP1 of the light emitting element LD, and the second semiconductor layer 13 may be disposed on the second end EP2 of the light emitting element LD.

In an embodiment, the light emitting element LD may be a light emitting element fabricated in the form of a pillar by an etching scheme or the like. In the specification, the term "pillar-type" embraces a rod-like shape and a bar-like shape such as a cylindrical shape and a prismatic shape having an aspect ratio greater than 1, and the cross-sectional shape thereof is not limited.

The light emitting element LD may have a small size corresponding to a range from the nanometer scale to the micrometer scale. For example, the light emitting element LD may have a diameter D (or a width) and/or a length L ranging from the nanometer scale to the micrometer scale. However, the size of the light emitting element LD is not limited thereto, and the size of the light emitting element LD may be changed in various ways depending on design conditions of various devices, e.g., a display device, using a light emitting device with the light emitting element LD as a light source.

The first semiconductor layer 11 may be a first conductive semiconductor layer. For example, the first semiconductor layer 11 may include a p-type semiconductor layer. For instance, the first semiconductor layer 11 may include a p-type semiconductor layer which includes at least one semiconductor material of InAlGaN, GaN, AlGaN, InGaN, and AlN, and may be doped with a first conductive dopant such as Mg. However, the material for forming the first semiconductor layer 11 is not limited thereto, and the first semiconductor layer 11 may be formed of various other materials.

The active layer 12 may be disposed between the first semiconductor layer 11 and the second semiconductor layer 13. The active layer 12 may include at least one structure of a single well structure, a multi-well structure, a single-quantum well structure, a multi-quantum well (MQW) structure, a quantum dot structure, and a quantum line structure, but the disclosure is not limited thereto. The active layer 12 may include GaN, InGaN, InAlGaN, AlGaN, and/or AlN. Various other materials may be used to form the active layer 12.

If a voltage equal to or greater than a threshold voltage is applied between the opposite ends of the light emitting element LD, the light emitting element LD may emit light by coupling of electron-hole pairs in the active layer 12. Because light emission of the light emitting element LD can be controlled based on the foregoing principle, the light emitting element LD may be used as a light source of various light emitting devices as well as a pixel of the display device.

The second semiconductor layer 13 may be disposed on the active layer 12 and include a semiconductor layer of a type different from that of the first semiconductor layer 11. The second semiconductor layer 13 may include an n-type semiconductor layer. For instance, the second semiconductor layer 13 may include an n-type semiconductor layer which includes at least one semiconductor material of InAlGaN, GaN, AlGaN, InGaN, and AlN, and is doped with a second conductive dopant such as Si, Ge, and/or Sn. However, the material for forming the second semiconductor layer 13 is not limited thereto, and the second semiconductor layer 13 may be formed of various other materials.

The second semiconductor layer 13 may include first to third areas 13A, 13B, and 13C having different doping concentrations. As such, in the case where the second semiconductor layer 13 includes the first to third areas 13A, 13B, and 13C having different doping concentrations, the dipole moment of the light emitting element LD may be increased, so that the alignment of light emitting elements LD in an operation of aligning the light emitting elements LD between electrodes ALE can be enhanced.

For example, the doping concentration of the second area 13B may be greater than the doping concentration of the first area 13A, and may be less than the doping concentration of the third area 13C. The second area 13B may be disposed between the first area 13A and the third area 13C. The first area 13A may be disposed between the active layer 12 and the second area 13B. In other words, the doping concentrations of the first to third areas 13A, 13B, and 13C may increase toward the second end EP2. However, the disclosure is not limited thereto. The doping concentrations of the first to third areas 13A, 13B, and 13C may be changed in various ways within a range in which the dipole moment of the light emitting element LD can be increased.

The intermediate layer 14 may be disposed between the first to third areas 13A, 13B, and 13C of the second semiconductor layer 13. The intermediate layer 14 may include a first intermediate layer 14A and a second intermediate layer 14B which are disposed between the first to third areas 13A, 13B, and 13C.

Figure 2:
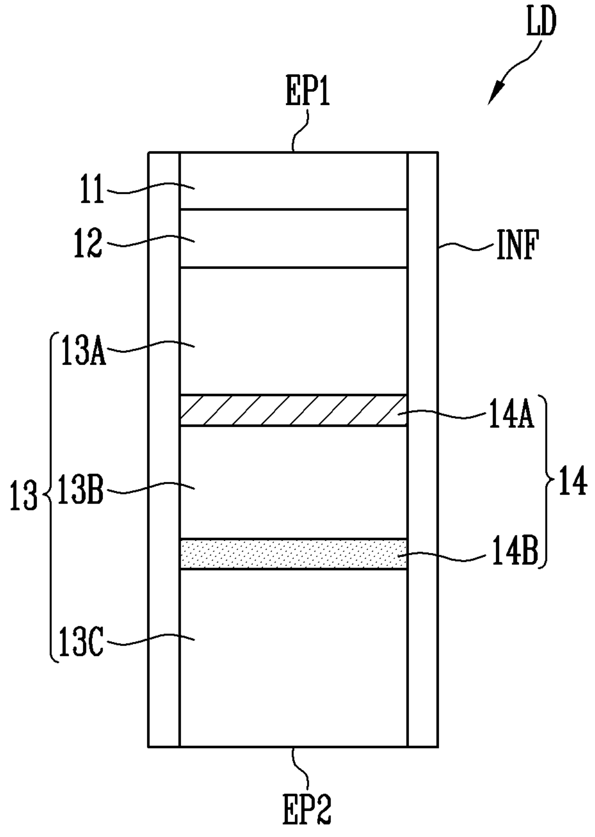
FIGS. 2 to 6 are schematic sectional views each illustrating a light emitting element in accordance with an embodiment.
Figure 3:
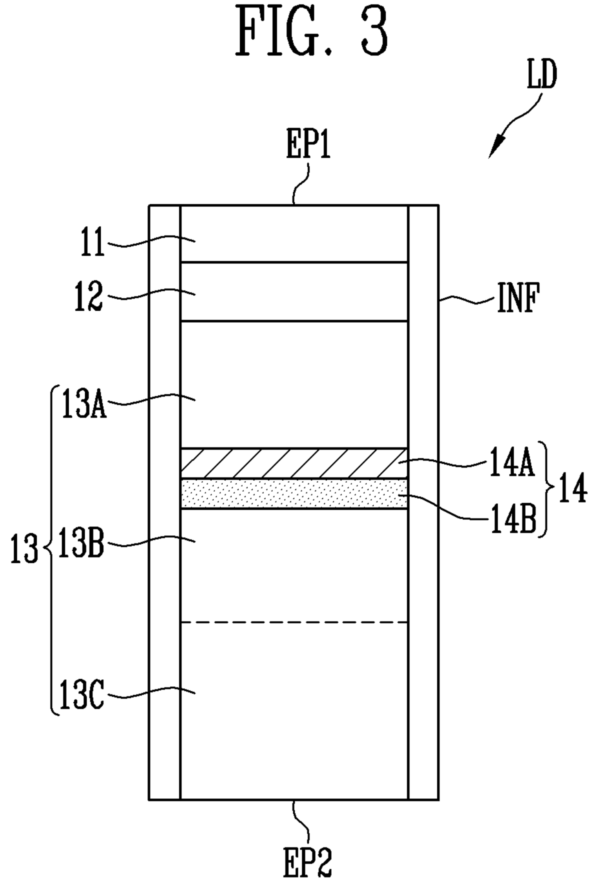
Figure 4:
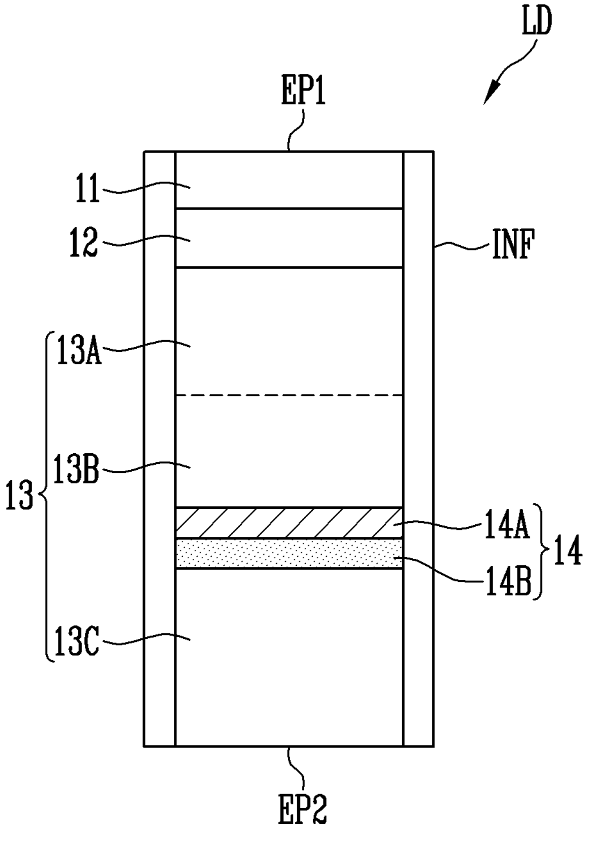
Figure 5:
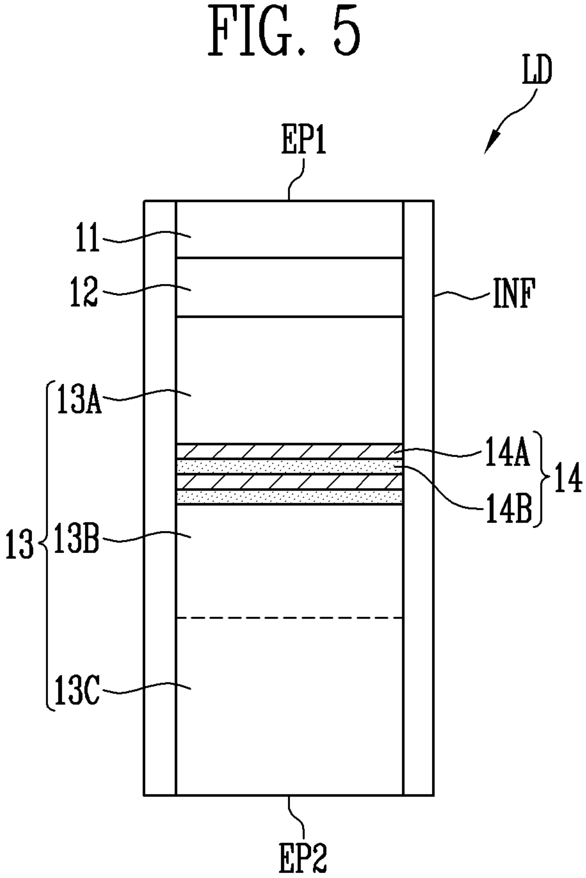
Figure 6:
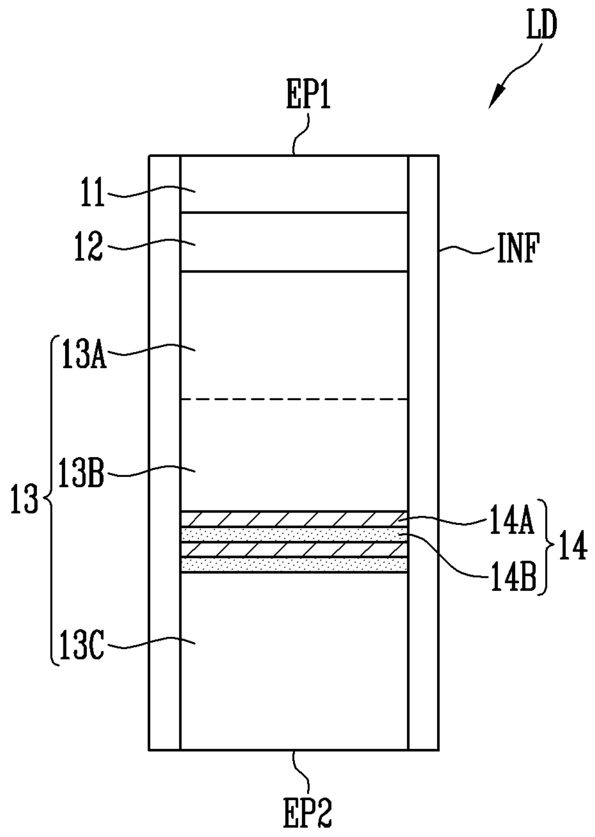

As illustrated in FIG. 2, the first intermediate layer 14A may be disposed on the first area 13A and the second area 13B. The second intermediate area 14B may be disposed between the second area 13B and the third area 13C. Here, the disposition of the intermediate layer 14 is not limited thereto. As illustrated in FIG. 3, the first intermediate layer 14A and the second intermediate layer 14B may be disposed between the first area 13A and the second area 13B. As illustrated in FIG. 4, the first intermediate layer 14A and the second intermediate layer 14B may be disposed between the second area 13B and the third area 13C. In an embodiment, as illustrated in FIG. 5, multiple first intermediate layers 14A and multiple second intermediate layers 14B may be alternately disposed between the first area 13A and the second area 13B. The numbers or arrangement of first intermediate layers 14A and second intermediate layers 14B is not limited to that of the embodiment of FIG. 5, and may be changed in various ways. In yet other embodiments, as illustrated in FIG. 6, multiple first intermediate layers 14A and multiple second intermediate layers 14B may be alternately disposed between the second area 13B and the third area 13C. The numbers or arrangement of first intermediate layers 14A and second intermediate layers 14B is not limited to that of the embodiment of FIG. 6, and may be changed in various ways.

The first intermediate layer 14A and the second intermediate layer 14B may respectively include different materials. For example, the first intermediate layer 14A and the second intermediate layer 14B each may include at least one different material among AlGaN, GaN, AlGaInN, AlN, SiN, $Si_3N_4$, and BN. Although the first intermediate layer 14A and the second intermediate layer 14B each include undoped material (e.g., GaN), embodiments are not limited thereto, and may be doped through a surface treatment process or the like so as to enhance the characteristics of the layer. However, the materials of the first intermediate layer 14A and the second intermediate layer 14B are not limited thereto, and various materials selected among materials that have high-bandgap with a small difference in lattice constant from the first to third areas 13A, 13B, and 13C of the second semiconductor layer 13 can be used.

As described above, in the case in which a combination of the first intermediate layer 14A and the second intermediate layer 14B formed of different materials is inserted between the first to third areas 13A, 13B, and 13C of the second semiconductor layer 13 which have different doping concentrations, diffusion of dopants between the first to third areas 13A, 13B, and 13C may be minimized, so that the dipole moment of the light emitting element LD can be increased. Furthermore, because the dipole moment can remain high by controlling movement of electrons in the operation of aligning the light emitting elements LD, the alignment of the light emitting elements LD can be enhanced.

An insulating layer INF may be provided on a surface of the light emitting element LD. The insulating layer INF may be directly disposed on a surface of the first semiconductor layer 11, a surface of the active layer 12, a surface of the second semiconductor layer 13, and/or a surface of the intermediate layer 14. The insulating layer INF may allow the first and second ends EP1 and EP2 of the light emitting element LD that have different polarities to be exposed.

The insulating layer INF may prevent the active layer 12 from short-circuiting due to making contact with conductive material except the first and second semiconductor layers 11 and 13. Furthermore, the insulating layer INF may minimize a surface defect of the light emitting elements LD, thus enhancing the lifetime and emission efficiency of the light emitting elements LD.

The insulating film INF may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium dioxide ($TiO_x$). For example, the insulating layer INF may have a double layer structure, and respective layers that form the double layer structure may include different materials. For example, the insulating layer INF may have a double layer structure formed of aluminum oxide ($AlO_x$) and silicon oxide ($SiO_x$), but the disclosure is not limited thereto. In an embodiment, the insulating layer INF may be omitted.

In an embodiment, an electrode layer (not illustrated) may be further disposed on the first end EP1 and/or the second end EP2 of the light emitting element LD. The electrode layer may include transparent metal or transparent metal oxide. For example, the electrode layer may include at least one of indium tin oxide (ITO), indium zinc oxide (IZO), and zinc tin oxide (ZTO), but the disclosure is not limited thereto. As such, in case that the electrode layer is formed of transparent metal or transparent metal oxide, light generated from the active layer 12 of the light emitting element LD may be emitted out of the light emitting element LD through the electrode layer.

A light emitting device including the light emitting element LD described above may be used not only in a display device but also in various devices which require a light source. For instance, light emitting elements LD may be disposed in each pixel of a display panel, so that the light emitting elements LD may be used as a light source of the pixel. However, the application field of the light emitting element LD is not limited to the above-mentioned examples. For example, the light emitting element LD may also be used in other types of devices such as a lighting device, which require a light source.

Figure 7:
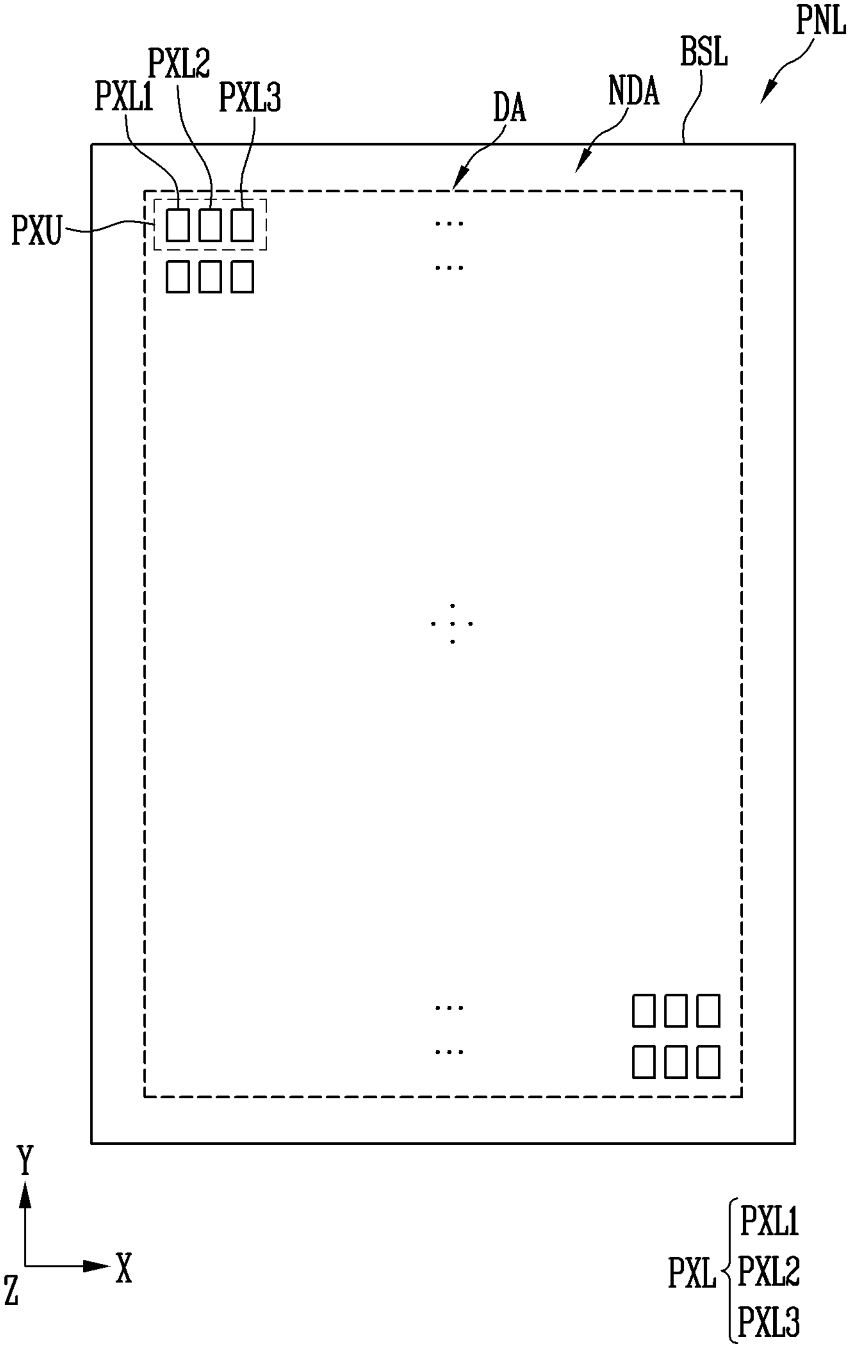
FIG. 7 is a schematic plan view illustrating a display device in accordance with an embodiment.

FIG. 7 is a schematic plan view illustrating a display device in accordance with an embodiment.

FIG. 7 illustrates a display device, particularly, a display panel PNL provided in the display device, as an example of an electronic device which may use, as a light source, the light emitting element LD described in the embodiments of FIGS. 1 to 6.

For the sake of explanation, FIG. 7 simply illustrates the structure of the display panel PNL in accordance with an embodiment, focused on a display area DA. In some embodiments, although not illustrated, at least one driving circuit (e.g., at least one of a scan driver and a data driver), lines, and/or pads may be further disposed on the display panel PNL.

Referring to FIG. 7, the display panel PNL and the base layer BSL for forming the display panel PNL may include a display area DA for displaying an image, and a non-display area NDA other than the display area DA. The display area DA may form a screen on which an image may be displayed. The non-display area NDA may be an area other than the display area DA.

A pixel unit PXU may be disposed in the display area DA. The pixel unit PXU may include a first pixel PXL1, a second pixel PXL2, and/or a third pixel PXL3. Hereinafter, the term "pixel PXL" or "pixels PXL" will be used to arbitrarily designate at least one pixel of the first pixel PXL1, the second pixel PXL2, and the third pixel PXL3, or collectively designate two or more kinds of pixels.

The pixels PXL may be regularly arranged according to a stripe or PenTile® arrangement structure. The arrangement structure of the pixels PXL is not limited thereto, and the pixels PXL may be arranged in the display area DA in various structures and/or schemes.

In an embodiment, two or more kinds of pixels PXL which emit different colors of light may be disposed in the display area DA. For example, first pixels PXL1 configured to emit a first color of light, second pixels PXL2 configured to emit a second color of light, and third pixels PXL3 configured to emit a third color of light may be arranged in the display area DA. At least one first pixel PXL1, at least one second pixel PXL2, and at least one third pixel PXL3 that are disposed adjacent to each other may form one pixel unit PXU which may emit various colors of light. For example, each of the first to third pixels PXL1, PXL2, and PXL3 may be a pixel configured to emit a certain color of light. In an embodiment, the first pixel PXL1 may be a red pixel configured to emit red light, a second pixel PXL2 may be a green pixel configured to emit green light, and a third pixel PXL3 may be a blue light configured to emit blue light. However, the disclosure is not limited thereto.

In an embodiment, the first pixel PXL1, the second pixel PXL2, and the third pixel PXL3 may respectively include light emitting elements configured to emit the same color of light, and color conversion layers and/or color filter layers pertaining to different colors may be disposed on the respective light emitting elements so that the first pixel PXL1, the second pixel PXL2, and the third pixel PXL3 may respectively emit the first color of light, the second color of light, and the third color of light. In an embodiment, the first pixel PXL1, the second pixel PXL2, and the third pixel PXL3 may respectively include, as light sources, a light emitting element related to the first color, a light emitting element related to the second color, and a light emitting element related to the third color, and thus may respectively emit the first color of light, the second color of light, and the third color of light. However, the colors, the types, and/or the number of pixels PXL that form each pixel unit PXU are not particularly limited. In other words, the color of light to be emitted from each pixel PXL may be changed in various ways.

The pixel PXL may include at least one light source which is driven by a control signal (e.g., a scan signal and a data signal) and/or a power supply (e.g., a first power supply and a second power supply). In an embodiment, the light source may include at least one light emitting element LD in accordance with any of the embodiments of FIGS. 1 and 2, e.g., subminiature column-type light emitting elements LD having a small size corresponding to a range from the nanometer scale to the micrometer scale. However, the disclosure is not limited thereto, and different types of light emitting elements LD may be used as a light source of the pixel PXL.

In an embodiment, each pixel PXL may be formed of an active pixel. However, the types, structures, and/or driving schemes of the pixels PXL applicable to the display device are not particularly limited. For example, each pixel PXL may be formed of a pixel for passive or active light emitting display devices which have various structures and/or may be operated in various driving schemes.

Figure 8:
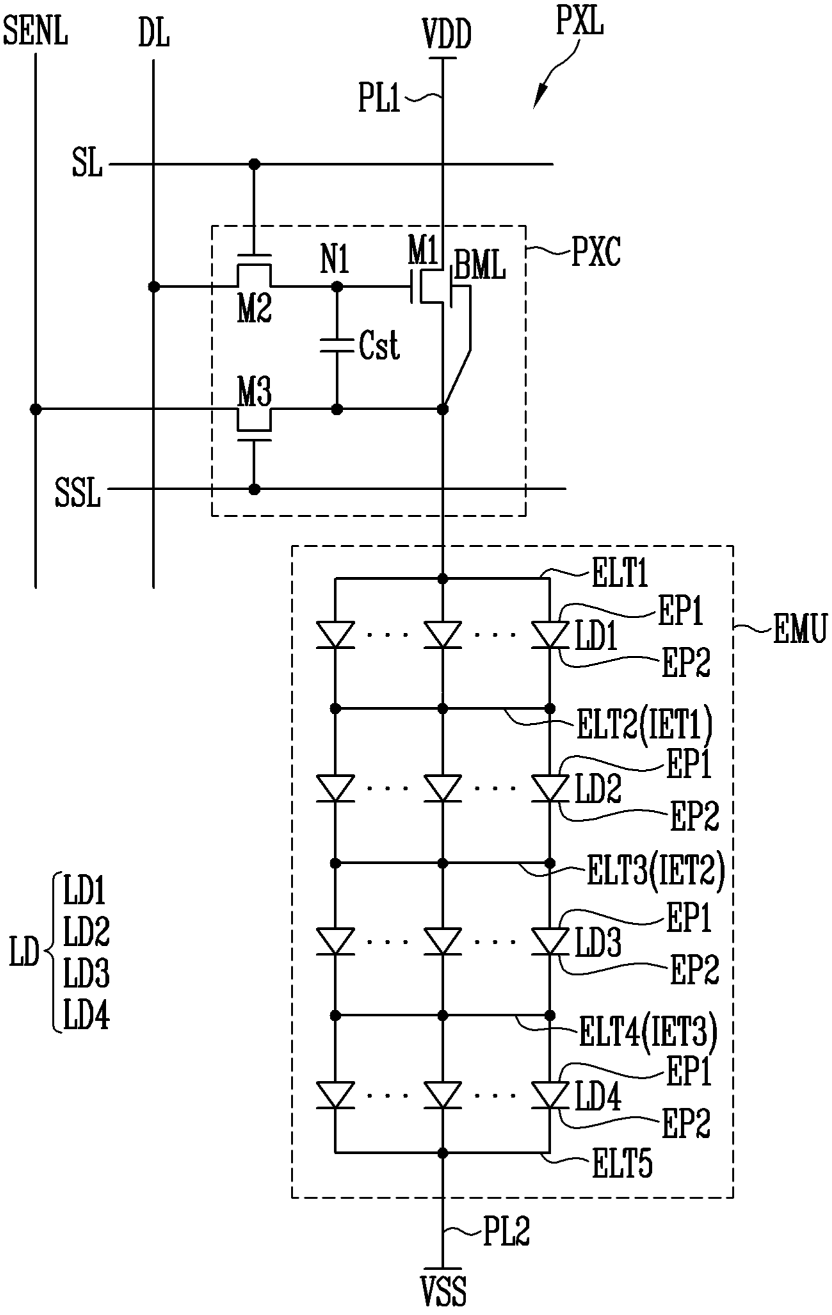
FIG. 8 is a schematic circuit diagram illustrating a pixel in accordance with an embodiment.

FIG. 8 is a schematic circuit diagram illustrating a pixel PXL in accordance with an embodiment.

The pixel PXL illustrated in FIG. 8 may be any of the first pixel PXL1, the second pixel PXL2, and the third pixel PXL3 that are provided on the display panel PNL of FIG. 7. The first pixel PXL1, the second pixel PXL2, and the third pixel PXL3 may have substantially identical or similar structures.

Referring to FIG. 8, the pixel PXL may include an emission component EMU configured to generate light having a luminance corresponding to a data signal, and a pixel circuit PXC configured to drive the emission component EMU.

The pixel circuit PXC may be connected between a first power supply VDD and the emission component EMU. Furthermore, the pixel circuit PXC may be connected to a scan line SL and a data line DL of the corresponding pixel PXL, and control the operation of the emission component EMU in response to a scan signal and a data signal supplied from the scan line SL and the data line DL. Furthermore, the pixel circuit PXC may be selectively further connected to a sensing signal line SSL and a sensing line SENL.

The pixel circuit PXC may include at least one transistor and at least one capacitor. For example, the pixel circuit PXC may include a first transistor M1, a second transistor M2, a third transistor M3, and a storage capacitor Cst.

The first transistor M1 may be connected between the first power supply VDD and a first connection electrode ELT1. A gate electrode of the first transistor M1 may be connected to the first node N1. The first transistor M1 may control driving current to be supplied to the emission component EMU in response to a voltage of the first node N1. In other words, the first transistor M1 may be a driving transistor configured to control the driving current of the pixel PXL.

In an embodiment, the first transistor M1 may selectively include a bottom conductive layer BML (referred also to as "bottom electrode", "back gate electrode" or "bottom light shielding layer"). The gate electrode and the bottom conductive layer BML of the first transistor M1 may overlap each other with an insulating layer interposed therebetween. In an embodiment, the bottom conductive layer BML may be connected to an electrode of the first transistor M1, e.g., a source or drain electrode of the first transistor M1.

In case that the first transistor M1 includes the bottom conductive layer BML, a back-biasing technique (or a sync technique) may be used, the back-biasing technique being a technique of shifting a threshold voltage of the first transistor M1 in a negative direction or a positive direction by applying a back-biasing voltage to the bottom conductive layer BML of the first transistor M1 in case that the pixel PXL is driven. For example, a source-sync technique may be used by connecting the bottom conductive layer BML to the source electrode of the first transistor M1, so that the threshold voltage of the first transistor M1 may be shifted in the negative direction or the positive direction. In case that the bottom conductive layer BML is disposed under a semiconductor pattern that forms a channel of the first transistor M1, the bottom conductive layer BML may function as a light shielding pattern and stabilize operating characteristics of the first transistor M1. However, the function and/or application scheme of the bottom conductive layer BML is not limited thereto.

The second transistor M2 may be connected between the data line DL and the first node N1. A gate electrode of the second transistor M2 may be connected to the scan line SL. In case that a scan signal having a gate-on voltage (e.g., a high-level voltage) is supplied from the scan line SL, the second transistor M2 may be turned on to connect the data line DL with the first node N1.

During each frame period, a data signal of the corresponding frame may be supplied to the data line DL, and the data signal may be transmitted to the first node N1 through the second transistor M2 that may be turned on during a period during which the scan signal having the gate-on voltage is supplied to the scan line SL. In other words, the second transistor M2 may be a switching transistor configured to transmit each data signal to the interior of the pixel PXL.

An electrode of the storage capacitor Cst may be connected to the first node N1, and a remaining electrode thereof may be connected to a second electrode of the first transistor M1. The storage capacitor Cst may be charged with a voltage corresponding to a data signal to be supplied to the first node N1 during each frame period.

The third transistor M3 may be connected between the first connection electrode ELT1 (or the second electrode of the first transistor M1) and the sensing line SENL. A gate electrode of the third transistor M3 may be connected to the sensing signal line SSL. The third transistor M3 may transmit a voltage value applied to the first connection electrode ELT1, to the sensing line SENL in response to a sensing signal supplied to the sensing signal line SSL. The voltage value transmitted through the sensing line SENL may be provided to an external circuit (e.g., a timing controller). The external circuit may extract information about characteristics of each pixel PXL (e.g., a threshold voltage of the first transistor M1, etc.) based on the provided voltage value. The extracted characteristic information may be used to convert image data to compensate for a deviation in characteristics between the pixels PXL.

Although FIG. 8 illustrates the case where all of the transistors included in the pixel circuit PXC may be formed of n-type transistors, the disclosure is not limited thereto. For example, at least one of the first, second, and third transistors M1, M2, and M3 may be a p-type transistor.

The structure and driving scheme of the pixel PXL may be changed in various ways. For instance, the pixel circuit PXC may not only be formed of the pixel circuit of the embodiment illustrated in FIG. 8 but may also be formed of a pixel circuit which may have various structures and/or be operated in various driving schemes.

For example, the pixel circuit PXC may not include the third transistor M3. Furthermore, the pixel circuit PXC may further include other circuit elements such as a compensation transistor configured to compensate for the threshold voltage of the first transistor M1, an initialization transistor configured to initialize the voltage of the first node N1 and/or the first connection electrode ELT1, an emission control transistor configured to control a period during which driving current is supplied to the emission component EMU, and/or a boosting capacitor configured to boost the voltage of the first node N1.

The emission component EMU may include at least one light emitting element LD, e.g., multiple light emitting elements LD, connected between the first power supply VDD and the second power supply VSS.

For example, the emission component EMU may include a first connection electrode ELT1 connected to the first power supply VDD by the pixel circuit PXC and the first power line PL1, a fifth connection electrode ELT5 connected to the second power supply VSS by the second power line PL2, and light emitting elements LD connected between the first and fifth connection electrodes ELT1 and ELT5.

The first power supply VDD and the second power supply VSS may have different potentials to allow the light emitting elements LD to emit light. For example, the first power supply VDD may be set as a high-potential power supply, and the second power supply VSS may be set as a low-potential power supply.

In an embodiment, the emission component EMU may include at least one serial stage. Each serial stage may include a pair of electrodes (e.g., two electrodes), and at least one light emitting element LD connected in a forward direction between the pair of electrodes. Here, the number of serial stages that form the emission component EMU and the number of light emitting elements LD that form each serial stage are not particularly limited. For example, the numbers of light emitting elements LD that form the respective serial stages may be identical with or different from each other. The number of light emitting elements LD of each serial stage is not particularly limited.

For example, the emission component EMU may include a first serial stage including at least one first light emitting element LD1, a second serial stage including at least one second light emitting element LD2, a third serial stage including at least one third light emitting element LD3, and a fourth serial stage including at least one fourth light emitting element LD4.

The first serial stage may include a first connection electrode ELT1, a second connection electrode ELT2, and at least one first light emitting element LD1 connected between the first and second connection electrodes ELT1 and ELT2. Each first light emitting element LD1 may be connected in the forward direction between the first and second connection electrodes ELT1 and ELT2. For example, a first end EP1 of the first light emitting element LD1 may be connected to the first connection electrode ELT1. A second end EP2 of the first light emitting element LD1 may be connected to the second connection electrode ELT2.

The second serial stage may include the second connection electrode ELT2, a third connection electrode ELT3, and at least one second light emitting element LD2 connected between the second and third connection electrodes ELT2 and ELT3. Each second light emitting element LD2 may be connected in the forward direction between the second and third connection electrodes ELT2 and ELT3. For example, a first end EP1 of the second light emitting element LD2 may be connected to the second connection electrode ELT2. A second end EP2 of the second light emitting element LD2 may be connected to the third connection electrode ELT3.

The third serial stage may include the third connection electrode ELT3, a fourth connection electrode ELT4, and at least one third light emitting element LD3 connected between the third and fourth connection electrodes ELT3 and ELT4. Each third light emitting element LD3 may be connected in the forward direction between the third and fourth connection electrodes ELT3 and ELT4. For example, a first end EP1 of the third light emitting element LD3 may be connected to the third connection electrode ELT3. A second end EP2 of the third light emitting element LD3 may be connected to the fourth connection electrode ELT4.

The fourth serial stage may include the fourth connection electrode ELT4, the fifth connection electrode ELT5, and at least one fourth light emitting element LD4 connected between the fourth and fifth connection electrodes ELT4 and ELT5. Each fourth light emitting element LD4 may be connected in the forward direction between the fourth and fifth connection electrodes ELT4 and ELT5. For example, a first end EP1 of the fourth light emitting element LD4 may be connected to the fourth connection electrode ELT4. A second end EP2 of the fourth light emitting element LD4 may be connected to the fifth connection electrode ELT5.

The $1^{st}$ electrode of the emission component EMU, e.g., the first connection electrode ELT1, may be an anode electrode of the emission component EMU. The last electrode of the emission component EMU, e.g., the fifth connection electrode ELT5, may be a cathode electrode of the emission component EMU.

Other electrodes of the emission component EMU, e.g., the second connection electrode ELT2, the third connection electrode ELT3, and/or the fourth connection electrode ELT4, each may form an intermediate electrode. For example, the second connection electrode ELT2 may form a first intermediate electrode IET1. The third connection electrode ELT3 may form a second intermediate electrode IET2. The fourth connection electrode ELT4 may form a third intermediate electrode IET3.

In case that the light emitting elements LD are connected to have a serial/parallel structure, power efficiency may be enhanced, compared to the case where an equal number of light emitting elements LD are connected only in parallel to each other. Furthermore, in the pixel PXL in which the light emitting elements LD are connected to have the serial/parallel structure, even if a short-circuit defect or the like occurs in some serial stages, sufficient luminance can be expressed by the light emitting elements LD of other serial stages, so that the probability of occurrence of a black spot defect in the pixel PXL can be reduced. However, the disclosure is not limited thereto. The emission component EMU may be formed by connecting the light emitting elements LD only in series. In other embodiments, the emission component EMU may be formed by connecting the light emitting elements LD only in parallel.

Each of the light emitting elements LD may include a first end EP1 (e.g., a p-type end) connected to the first power supply VDD via at least one electrode (e.g., the first connection electrode ELT1), the pixel circuit PXC, and/or the first power line PL1, and a second end EP2 (e.g., an n-type end) connected to the second power supply VSS via at least another electrode (e.g., the fifth connection electrode ELT5), and the second power line PL2. In other words, the light emitting elements LD may be connected in the forward direction between the first power supply VDD and the second power supply VSS. The light emitting elements LD connected in the forward direction may form valid light sources of the emission component EMU.

The light emitting elements LD may emit, in case that driving current is supplied thereto through the corresponding pixel circuit PXC, light having a luminance corresponding to the driving current. For example, during each frame period, the pixel circuit PXC may supply driving current corresponding to a grayscale value to be represented in the corresponding frame to the emission component EMU. Hence, the light emitting elements LD may emit light having luminance corresponding to the driving current, so that the emission component EMU may express the luminance corresponding to the driving current.

Figure 9:
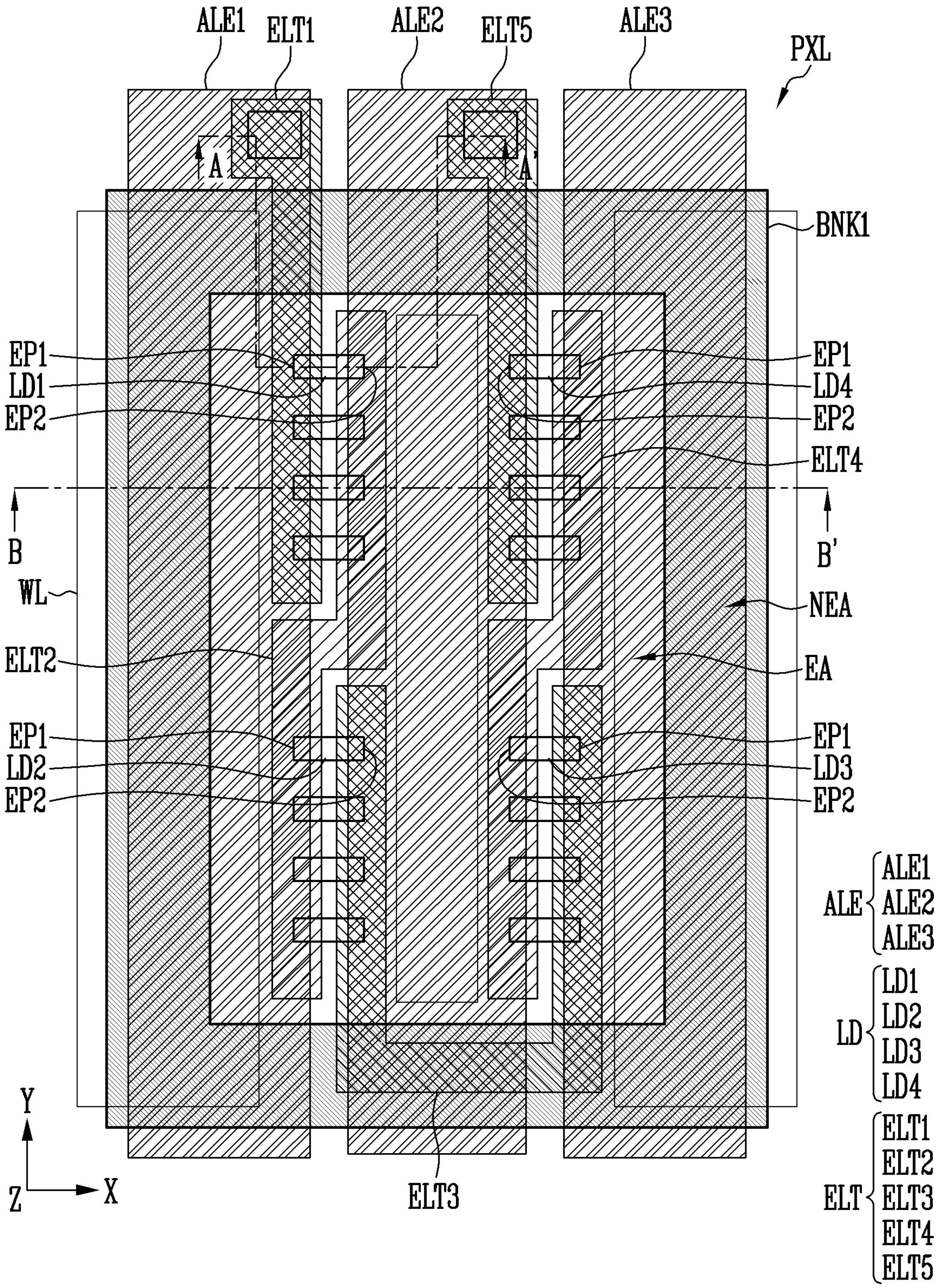
FIGS. 9 and 10 are schematic plan views illustrating a pixel in accordance with an embodiment.
Figure 10:
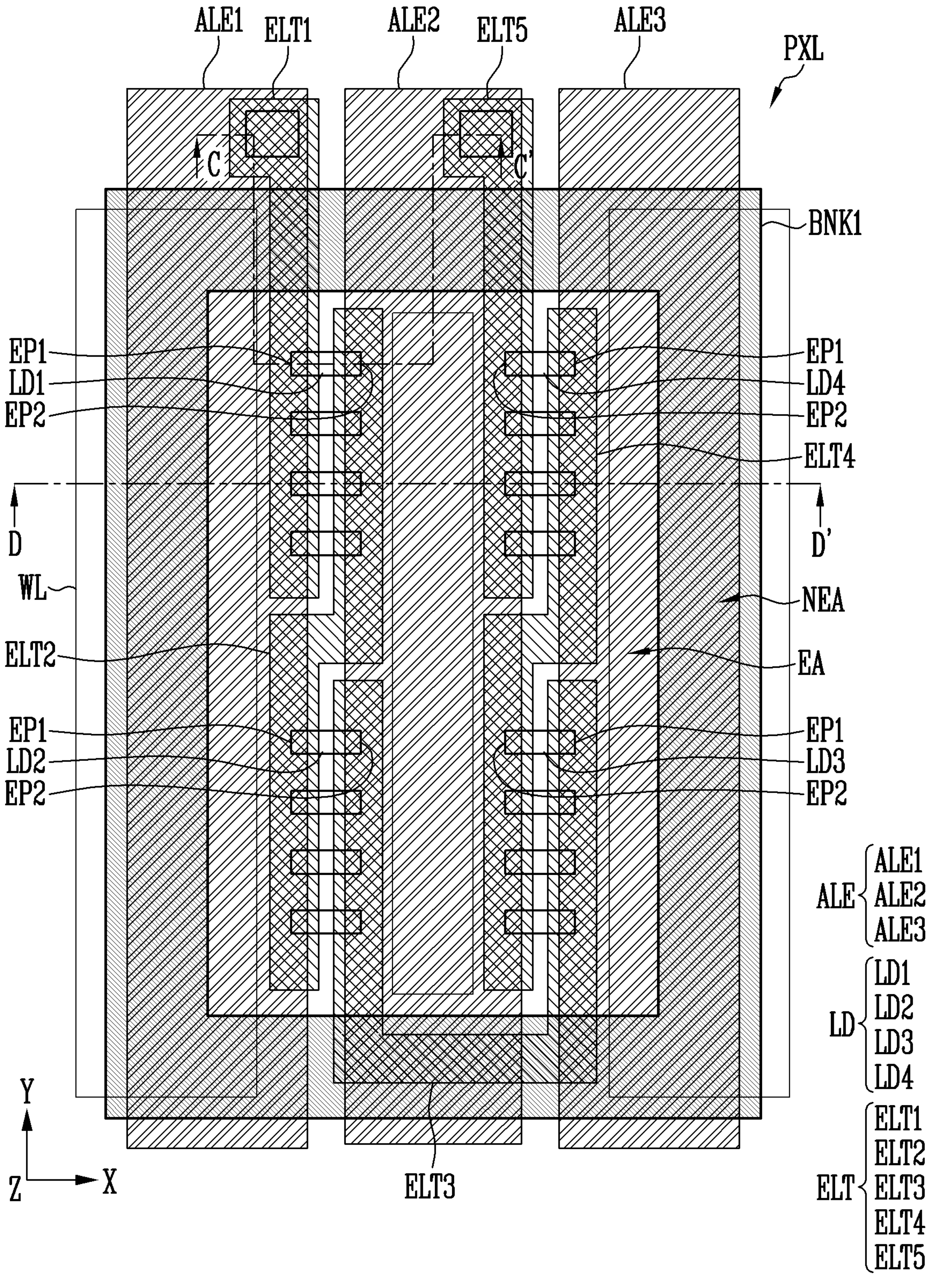
Figure 11:
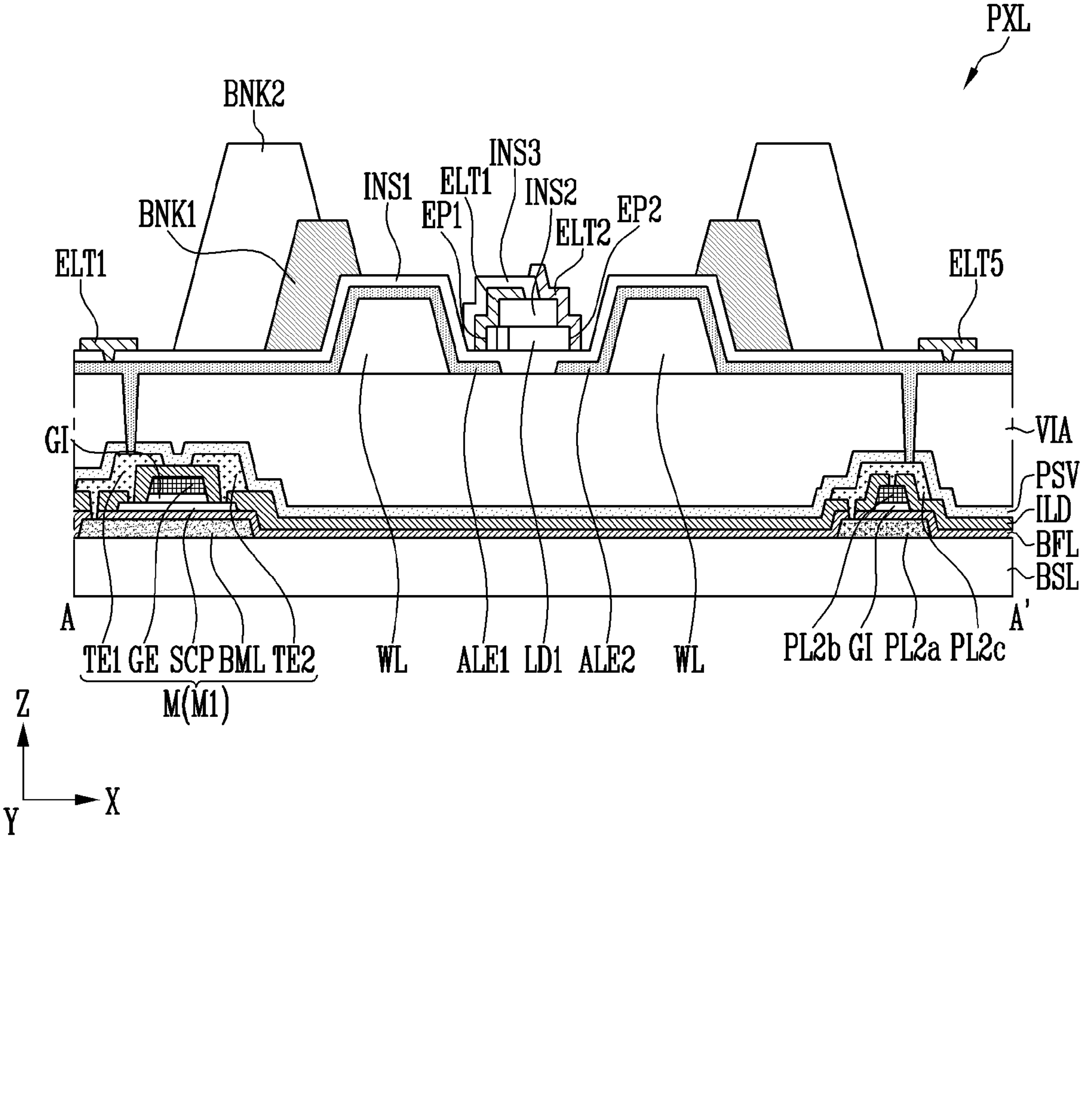
FIG. 11 is a schematic sectional view taken along line A-A' of FIG. 9.
Figure 12:
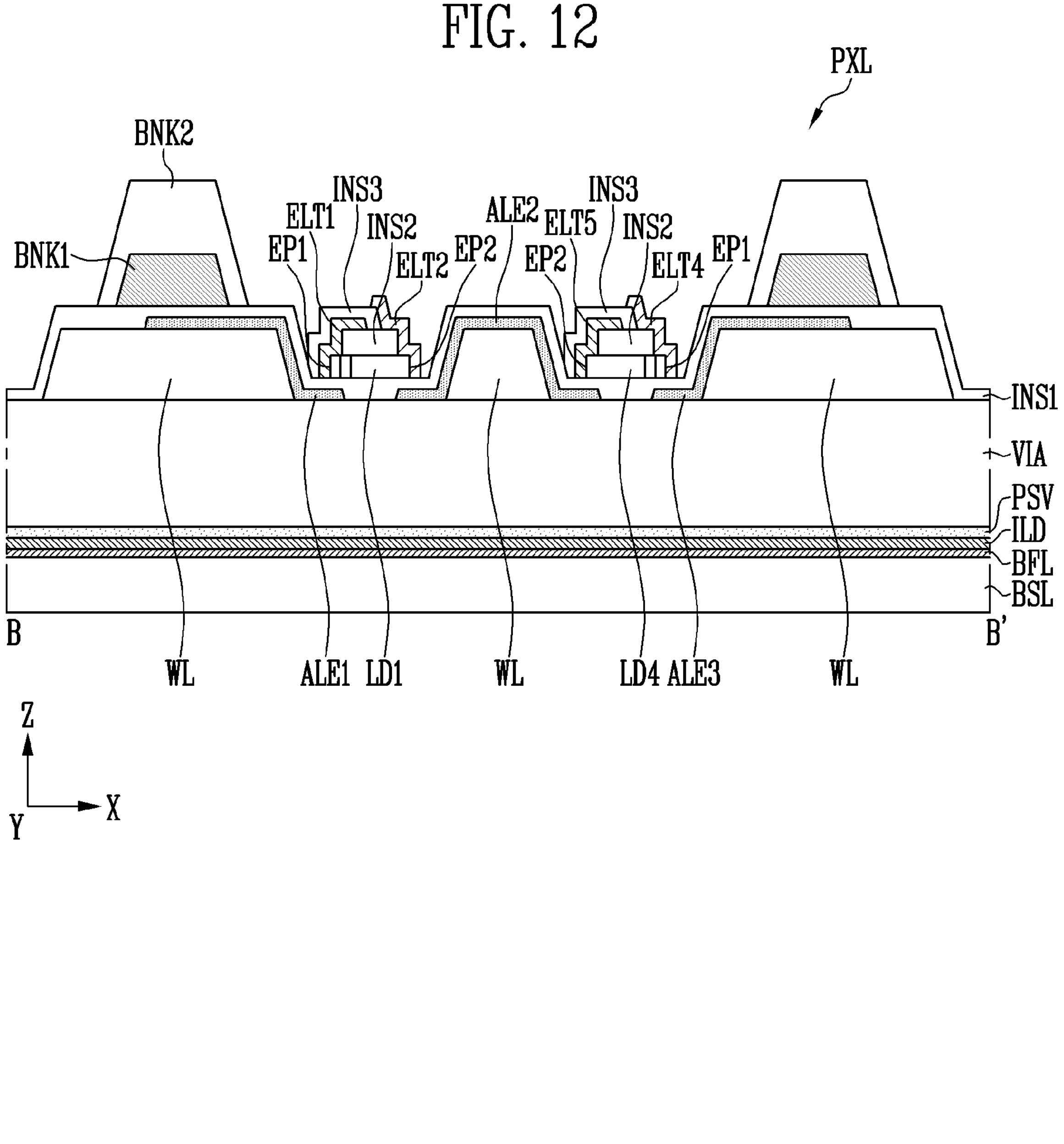
FIG. 12 is a schematic sectional view taken along line B-B' of FIG. 9.
Figure 13:
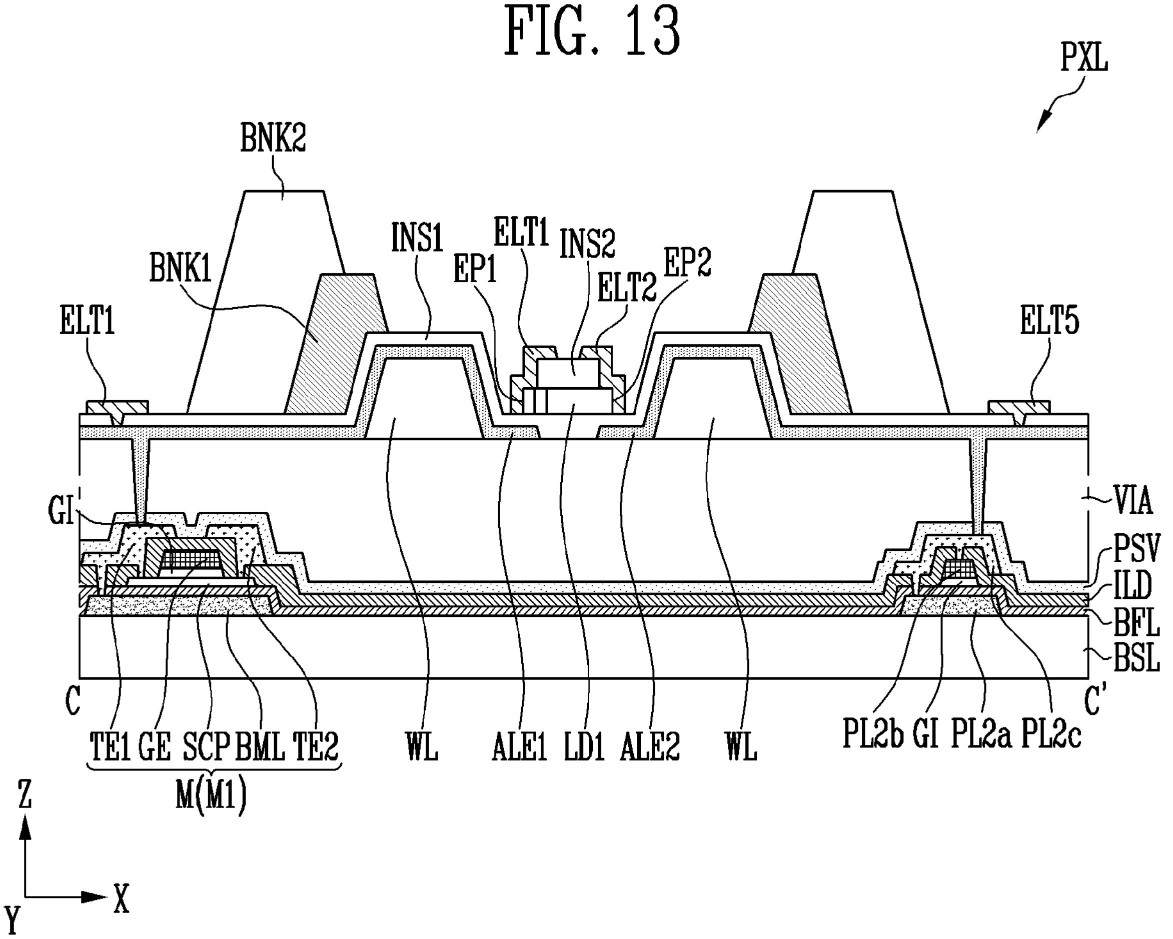
FIG. 13 is a schematic sectional view taken along line C-C' of FIG. 10.
Figure 14:
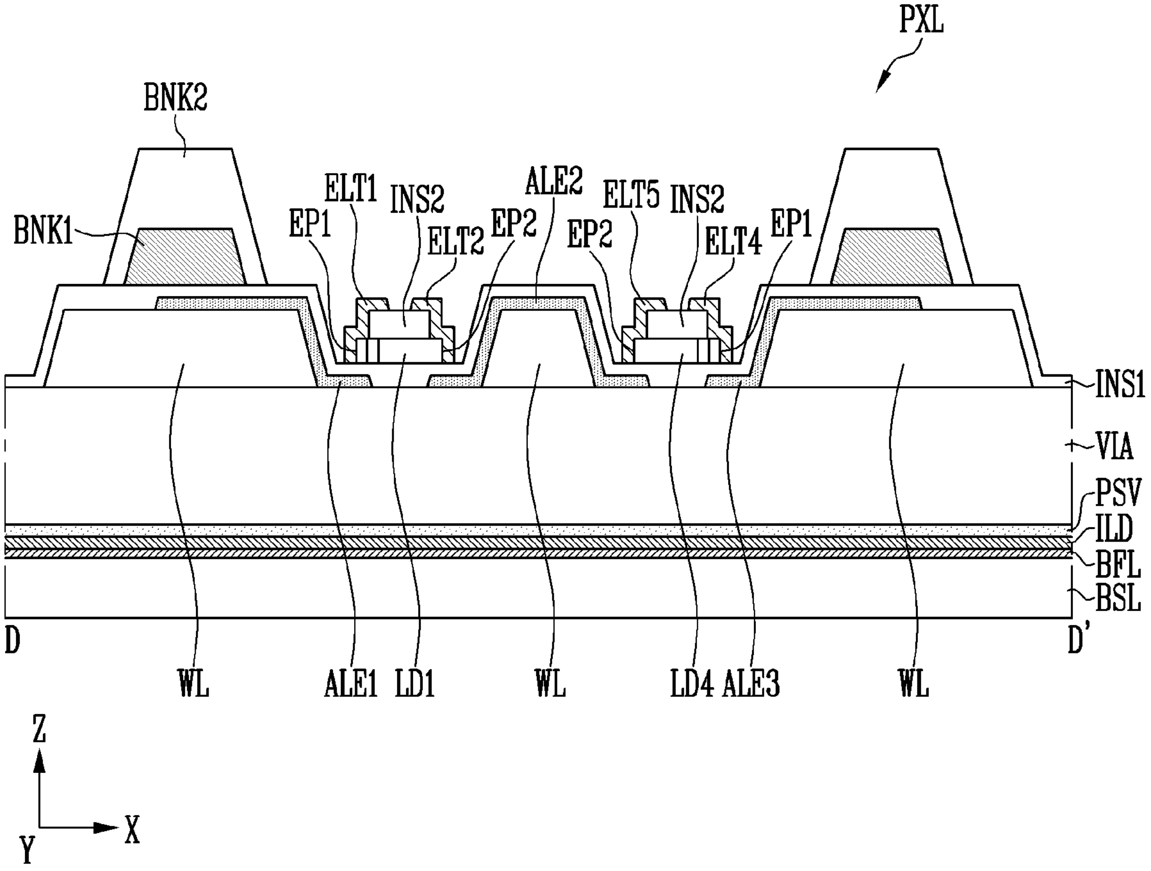
FIG. 14 is a schematic sectional view taken along line D-D' of FIG. 10.

FIGS. 9 and 10 are schematic plan views illustrating the pixel PXL in accordance with an embodiment. FIG. 11 is a schematic sectional view taken along line A-A' of FIG. 9. FIG. 12 is a schematic sectional view taken along line B-B' of FIG. 9. FIG. 13 is a schematic sectional view taken along line C-C' of FIG. 10. FIG. 14 is a schematic sectional view taken along line D-D' of FIG. 10.

For example, the pixel PXL of FIGS. 9 and 10 may be any of the first to third pixels PXL1, PXL2, and PXL3 that form the pixel unit PXU of FIG. 7, and the first to third pixels PXL1, PXL2, and PXL3 may have substantially identical or similar structures. Although FIGS. 9 and 10 illustrates an embodiment in which, as illustrated in FIG. 8, each pixel PXL includes light emitting elements LD disposed in four serial stages, the number of serial stages in the pixel PXL may be changed in various ways depending on embodiments.

Hereinafter, the term "light emitting element LD" or "light emitting elements LD" will be used to arbitrarily designate at least one light emitting element of the first to fourth light emitting elements LD1, LD2, LD3, and LD4, or collectively designate two or more kinds of light emitting elements. Furthermore, the term "electrode ALE" or "electrodes ALE" will be used to arbitrarily designate at least one of electrodes including the first to third electrodes ALE1, ALE2, and ALE3. The term "connection electrode ELT" or "connection electrode ELT" will be used to arbitrarily designate at least one electrode including the first to fifth connection electrodes ELT1, ELT2, ELT3, ELT4, and ELT5.

Referring to FIGS. 9 and 10, the pixel PXL may include an emission area EA and a non-emission area NEA. The emission area EA may be an area which includes light emitting elements LD and is able to emit light. The non-emission area NEA may be disposed to enclose the emission area EA. The non-emission area NEA may be an area where a first bank BNK1 enclosing the emission area EA is provided. The first bank BNK1 may be provided in the non-emission area NEA and be disposed to at least partially enclose the emission area EA.

The first bank BNK1 may include an opening that overlaps the emission area EA. The opening of the first bank BNK1 may provide, at the step of supplying the light emitting elements LD to each pixel PXL, space to which the light emitting elements LD may be provided. For example, a desired kind and/or amount of light emitting element ink may be supplied to the space defined by the opening of the first bank BNK1.

The first bank BNK1 may include organic material such as acrylic resin, epoxy resin, phenolic resin, polyamide resin, polyimide resin, polyester resin, polyphenylene sulfide resin, and/or benzocyclobutene (BCB). However, the disclosure is not limited thereto. The first bank BNK1 may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and/or titanium oxide ($TiO_x$).

In an embodiment, the first bank BNK1 may include at least one light shielding and/or reflective material. Therefore, a light leakage between adjacent pixels PXL may be prevented from being caused. For example, the first bank BNK1 may include at least one black pigment.

The pixels PXL each may include partition walls WL, electrodes ALE, light emitting elements LD, and/or connection electrodes ELT.

The partition walls WL may overlap the emission area EA and be spaced apart from each other. The partition walls WL may be at least partially provided in the non-emission area NEA. The partition walls WL may extend in a second direction (a Y-axis direction) and be spaced apart from each other in a first direction (an X-axis direction).

The partition walls WL each may partially overlap at least one electrode ALE in at least the emission area EA. For example, the partition walls WL may be respectively provided under the electrodes ALE. Since the partition walls WL are provided under respective partial areas of the electrodes ALE, the respective partial areas of the electrodes ALE may protrude in an upward direction of the pixel PXL, i.e., in a third direction (a Z-axis direction), in the areas where the partition walls WL are formed. In case that the partition walls WL and/or the electrodes ALE include reflective material, a reflective wall structure may be formed around the light emitting elements LD. Hence, light emitted from the light emitting elements LD may be emitted in an upward direction of the pixel PXL (e.g., in a frontal direction of the display panel PNL including a certain viewing angle range), so that the light output efficiency of the display panel PNL may be improved.

The electrodes ALE may be provided in at least the emission area EA. The electrodes ALE may extend in the second direction (the Y-axis direction) and be spaced apart from each other in the first direction (the X-axis direction).

The first to third electrodes ALE1, ALE2, and ALE3 each may extend in the second direction (the Y-axis direction), and may be spaced apart from each other in the first direction (the X-axis direction) and successively disposed. Some of the electrodes ALE may be connected to the pixel circuit (PXC of FIG. 8) and/or a power line through a contact hole. For example, the first electrode ALE1 may be connected to the pixel circuit PXC and/or the first power line PL1 through a contact hole, and the second electrode ALE2 may be connected to the second power line PL2 through a contact hole.

In an embodiment, some of the electrodes ALE may be electrically connected to some of the connection electrodes ELT through a contact hole. For example, the first electrode ALE1 may be electrically connected to the first connection electrode ELT1 through a contact hole. The second electrode ALE2 may be electrically connected to the fifth connection electrode ELT5 through a contact hole.

A pair of alignment electrodes ALE adjacent to each other may be supplied with different signals at the step of aligning the light emitting elements LD. For example, in case that the first to third electrodes ALE1, ALE2, and ALE3 are successively arranged in the first direction (the X-axis direction), the first electrode ALE1 and the second electrode ALE2 may be supplied with different alignment signals, and the second electrode ALE2 and the third electrode ALE3 may be supplied with different alignment signals.

The light emitting elements LD may be aligned between a pair of electrodes ALE in each emission area EA. Furthermore, the light emitting elements LD each may be electrically connected between a pair of connection electrodes ELT.

The first light emitting element LD1 may be aligned between the first and second electrodes ALE1 and ALE2. The first light emitting element LD1 may be electrically connected between the first and second connection electrodes ELT1 and ELT2. For example, the first light emitting element LD1 may be aligned in first areas (e.g., upper end areas) of the first and second electrodes ALE1 and ALE2. The first end EP1 of the first light emitting element LD1 may be electrically connected to the first connection electrode ELT1. The second end EP2 of the first light emitting element LD1 may be electrically connected to the second connection electrode ELT2.

The second light emitting element LD2 may be aligned between the first and second electrodes ALE1 and ALE2. The second light emitting element LD2 may be electrically connected between the second and third connection electrodes ELT2 and ELT3. For example, the second light emitting element LD2 may be aligned in second areas (e.g., lower end areas) of the first and second electrodes ALE1 and ALE2. The first end EP1 of the second light emitting element LD2 may be electrically connected to the second connection electrode ELT2. The second end EP2 of the second light emitting element LD2 may be electrically connected to the third connection electrode ELT3.

The third light emitting element LD3 may be aligned between the second and third electrodes ALE2 and ALE3. The third light emitting element LD3 may be electrically connected between the third and fourth connection electrodes ELT3 and ELT4. For example, the third light emitting element LD3 may be aligned in second areas (e.g., lower end areas) of the second and third electrodes ALE2 and ALE3. The first end EP1 of the third light emitting element LD3 may be electrically connected to the third connection electrode ELT3. The second end EP2 of the third light emitting element LD3 may be electrically connected to the fourth connection electrode ELT4.

The fourth light emitting element LD4 may be aligned between the second and third electrodes ALE2 and ALE3. The fourth light emitting element LD4 may be electrically connected between the fourth and fifth connection electrodes ELT4 and ELT5. For example, the fourth light emitting element LD4 may be aligned in first areas (e.g., upper end areas) of the second and third electrodes ALE2 and ALE3.

The first end EP1 of the fourth light emitting element LD4 may be electrically connected to the fourth connection electrode ELT4. The second end EP2 of the fourth light emitting element LD4 may be electrically connected to the fifth connection electrode ELT5.

For example, the first light emitting element LD1 may be disposed in a left upper end area of the emission area EA. The second light emitting element LD2 may be disposed in a left lower end area of the emission area EA. The third light emitting element LD3 may be disposed in a right lower end area of the emission area EA. The fourth light emitting element LD4 may be disposed in a right upper end area of the emission area EA. Here, the arrangement and/or connection structure of the light emitting elements LD may be changed in various ways depending on the structure of the emission component EMU and/or the number of serial stages.

The connection electrodes ELT each may be provided in at least the emission area EA, and be disposed to overlap at least one electrode ALE and/or light emitting element LD. For example, the connection electrodes ELT may be provided on the electrodes ALE and/or the light emitting elements LD in such a way that each of the connection electrodes ELT overlaps the corresponding electrodes ALE and/or the corresponding light emitting elements LD, whereby the connection electrodes ELT may be electrically connected to the light emitting elements LD.

The first connection electrode ELT1 may be disposed on the first area (e.g., the upper end area) of the first electrode ALE1 and the first ends EP1 of the first light emitting elements LD1, and thus electrically connected to the first ends EP1 of the first light emitting elements LD1.

The second connection electrode ELT2 may be disposed on the first area (e.g., the upper end area) of the second electrode ALE2 and the second ends EP2 of the first light emitting elements LD1, and thus electrically connected to the second ends EP2 of the first light emitting elements LD1. Furthermore, the second connection electrode ELT2 may be disposed on the second area (e.g., the lower end area) of the first electrode ALE1 and the first ends EP1 of the second light emitting elements LD2, and thus electrically connected to the first ends EP1 of the second light emitting elements LD2. For example, the second connection electrode ELT2 may electrically connect the second ends EP2 of the first light emitting elements LD1 and the first ends EP1 of the second light emitting elements LD2 to each other in the emission area EA. To this end, the second connection electrode ELT2 may have a bent shape. For example, the second connection electrode ELT2 may have a bent or curved structure on a boundary between an area where at least one first light emitting element LD1 is disposed and an area where at least one second light emitting element LD2 is disposed.

The third connection electrode ELT3 may be disposed on the second area (e.g., the lower end area) of the second electrode ALE2 and the second ends EP2 of the second light emitting elements LD2, and thus electrically connected to the second ends EP2 of the second light emitting elements LD2. Furthermore, the third connection electrode ELT3 may be disposed on the second area (e.g., the lower end area) of the third electrode ALE3 and the first ends EP1 of the third light emitting elements LD3, and thus electrically connected to the first ends EP1 of the third light emitting elements LD3. For example, the third connection electrode ELT3 may electrically connect the second ends EP2 of the second light emitting elements LD2 and the first ends EP1 of the third light emitting elements LD3 to each other in the emission area EA. To this end, the third connection electrode ELT3 may have a bent shape. For example, the third connection electrode ELT3 may have a bent or curved structure on a boundary between an area where at least one second light emitting element LD2 is disposed and an area where at least one third light emitting element LD3 is disposed.

The fourth connection electrode ELT4 may be disposed on the second area (e.g., the lower end area) of the second electrode ALE2 and the second ends EP2 of the third light emitting elements LD3, and thus electrically connected to the second ends EP2 of the third light emitting elements LD3. Furthermore, the fourth connection electrode ELT4 may be disposed on the first area (e.g., the upper end area) of the third electrode ALE3 and the first ends EP1 of the fourth light emitting elements LD4, and thus electrically connected to the first ends EP1 of the fourth light emitting elements LD4. For example, the fourth connection electrode ELT4 may electrically connect the second ends EP2 of the third light emitting elements LD3 and the first ends EP1 of the fourth light emitting elements LD4 to each other in the emission area EA. To this end, the fourth connection electrode ELT4 may have a bent shape. For example, the fourth connection electrode ELT4 may have a bent or curved structure on a boundary between an area where at least one third light emitting element LD3 is disposed and an area where at least one fourth light emitting element LD4 is disposed.

The fifth connection electrode ELT5 may be disposed on the first area (e.g., the upper end area) of the second electrode ALE2 and the second ends EP2 of the fourth light emitting elements LD4, and thus electrically connected to the second ends EP2 of the fourth light emitting elements LD4.

The first connection electrode ELT1, the third connection electrode ELT3, and/or the fifth connection electrode ELT5 may be formed of an identical conductive layer. Furthermore, the second connection electrode ELT2 and the fourth connection electrode ELT4 may be formed of an identical conductive layer. For example, as illustrated in FIG. 9, the connection electrodes ELT may be formed of multiple conductive layers. In other words, the first connection electrode ELT1, the third connection electrode ELT3, and/or the fifth connection electrode ELT5 may be formed of a first conductive layer. The second connection electrode ELT2 and the fourth connection electrode ELT4 may be formed of a second conductive layer different form the first conductive layer. In other embodiments, as illustrated in FIG. 10, the first to fifth connection electrodes ELT1, ELT2, ELT3, ELT4, and ELT5 may be formed of an identical conductive layer.

In this way, the light emitting elements LD aligned between the electrodes ALE may be connected in a desired form by using the connection electrodes ELT. For example, the first light emitting elements LD1, the second light emitting elements LD2, the third light emitting elements LD3, and the fourth light emitting elements LD4 may be successively connected in series by using the connection electrodes ELT.

Hereinafter, a cross-sectional structure of the pixel PXL will be described in more detail with reference to FIGS. 11 to 14. FIGS. 11 to 14 illustrate a first transistor M1 of various circuit elements that form the pixel circuit (refer to PXC of FIG. 8). In case that there is no need to separately designate the first to third transistors M1, M2, and M3, the term "transistor M" will be collectively used. The structures of the transistors M and/or positions in layers thereof are not limited to those of the embodiment shown in FIGS. 11 and 13 and may be changed in various ways depending on embodiments.

The pixels PXL in accordance with an embodiment may include circuit elements including transistors M disposed on the base layer BSL, and various lines connected to the circuit elements. The electrodes ALE, the light emitting elements LD, the connection electrode ELT, the first bank BNK1, and/or the second bank BNK2 that form the emission component EMU may be disposed on the circuit elements.

The base layer BSL may form a base and be formed of a rigid or flexible substrate or film. For example, the base layer BSL may be a rigid substrate made of glass or reinforced glass, a flexible substrate (or a thin film) formed of plastic or metal, or at least one insulating layer. The material and/or properties of the base layer BSL are not particularly limited. In an embodiment, the base layer BSL may be substantially transparent. Here, the words "substantially transparent" may mean that light can pass through the base layer BSL at a certain transmissivity or more. In an embodiment, the base layer BSL may be translucent or opaque. Furthermore, the base layer BSL may include reflective material in some embodiments.

The bottom conductive layer BML and a first power conductive layer PL2*a* may be disposed on the base layer BSL. The bottom conductive layer BML and the first power conductive layer PL2*a* may be disposed on the same layer. For example, the bottom conductive layer BML and the first power conductive layer PL2*a* may be simultaneously formed through the same process, but the disclosure is not limited thereto. The first power conductive layer PL2*a* may form the second power line PL2 described with reference to FIG. 8 or the like.

The bottom conductive layer BML and the first power conductive layer PL2*a* each may have a single layer structure or a multilayer structure that is formed of molybdenum (Mo), copper (Cu), aluminum (Al), chrome (Cr), gold (Au), titanium (Ti), nickel (Ni), neodymium (Nd), indium (In), tin (Sn), and/or an oxide or alloy thereof.

A buffer layer BFL may be disposed on the bottom conductive layer BML and the first power conductive layer PL2*a*. The buffer layer BFL may prevent impurities from diffusing into a circuit element. The buffer layer BFL may be formed of a single layer, or may be formed of multiple layers having at least two or more layers. In case that the buffer layer BFL has a multilayer structure, the respective layers may be formed of the same material or different materials.

A semiconductor pattern SCP may be disposed on the buffer layer BFL. For example, the semiconductor pattern SCP may include a first area which contacts a first transistor electrode TE1, a second area which contacts a second transistor electrode TE2, and a channel area disposed between the first and second areas. In an embodiment, one of the first and second areas may be a source area, and another may be a drain area.

In an embodiment, the semiconductor pattern SCP may be formed of polysilicon, amorphous silicon, an oxide semiconductor, and/or the like. The channel area of the semiconductor pattern SCP may be an intrinsic semiconductor, which may be an undoped semiconductor pattern. Each of the first and second areas of the semiconductor pattern SCP may be a semiconductor doped with a dopant.

A gate insulating layer GI may be disposed on the buffer layer BFL and the semiconductor pattern SCR For example, the gate insulating layer GI may be disposed between the semiconductor pattern SCP and the gate electrode GE. Furthermore, the gate insulating layer GI may be disposed between the buffer layer BFL and a second power conductive layer PL2*b*. The gate insulating layer GI may be formed of a single layer or multiple layers, and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and/or titanium oxide ($TiO_x$).

The gate electrode GE of the transistor M and the second power conductive layer PL2*b* may be disposed on the gate insulating layer GI. The gate electrode GE and the second power conductive layer PL2*b* may be disposed on the same layer. For example, the gate electrode GE and the second power conductive layer PL2*b* may be simultaneously formed through the same process, but the disclosure is not limited thereto. The gate electrode GE may be disposed on the gate insulating layer GI and overlap the semiconductor pattern SCP in the third direction DR3 (the Z-axis direction). The second power conductive layer PL2*b* may be disposed on the gate insulating layer GI and overlap the first power conductive layer PL2*a* in the third direction DR3 (the Z-axis direction). The second power conductive layer PL2*b* along with the first power conductive layer PL2*a* may form the second power line PL2 described with reference to FIG. 8 or the like.

The gate electrode GE and the second power conductive layer PL2*b* each may have a single layer structure or a multilayer structure that is formed of molybdenum (Mo), copper (Cu), aluminum (Al), chrome (Cr), gold (Au), titanium (Ti), nickel (Ni), neodymium (Nd), indium (In), tin (Sn), and/or an oxide or alloy thereof. For example, the gate electrode GE and the second power conductive layer PL2*b* each may have a multilayer structure formed by successively or repeatedly stacking titanium (Ti), copper (Cu), and/or indium tin oxide (ITO).

An interlayer insulating layer ILD may be disposed on the gate electrode GE and the second power conductive layer PL2*b*. For example, the interlayer insulating layer ILD may be disposed between the gate electrode GE and the first and second transistor electrodes TE1 and TE2. Furthermore, the interlayer insulating layer ILD may be disposed between the second power conductive layer PL2*b* and a third power conductive layer PL2*c*.

The interlayer insulating layer ILD may be formed of a single layer or multiple layers, and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and/or titanium oxide ($TiO_x$).

The first and second transistor electrodes TE1 and TE2 of the transistor M and the third power conductive layer PL2*c* may be disposed on the interlayer insulating layer ILD. The first and second transistor electrodes TE1 and TE2 and the third power conductive layer PL2*c* may be disposed on the same layer. For example, the first and second transistor electrodes TE1 and TE2 and the third power conductive layer PL2*c* may be simultaneously formed through the same process, but the disclosure is not limited thereto.

The first and second transistor electrodes TE1 and TE2 may be disposed to overlap the semiconductor pattern SCP in the third direction DR3 (the Z-axis direction). The first and second transistor electrodes TE1 and TE2 may be electrically connected to the semiconductor pattern SCP. For example, the first transistor electrode TE1 may be electrically connected with the first area of the semiconductor pattern SCP through a contact hole passing through the interlayer insulating layer ILD. Furthermore, the first transistor electrode TE1 may be electrically connected with the bottom conductive layer BML through a contact hole passing through the interlayer insulating layer ILD and the buffer layer BFL. The second transistor electrode TE2 may be electrically connected with the second area of the semiconductor pattern SCP through a contact hole passing through the interlayer insulating layer ILD. In an embodiment, any one of the first and second transistor electrodes TE1 and TE2 may be a source electrode, and another may be a drain electrode.

The third power conductive layer PL2*c* may be disposed to overlap the first power conductive layer PL2*a* and/or the second power conductive layer PL2*b* in the third direction (the Z-axis direction). The third power conductive layer PL2*c* may be electrically connected to the first power conductive layer PL2*a* and/or the second power conductive layer PL2*b*. For example, the third power conductive layer PL2*c* may be electrically connected to the first power conductive layer PL2*a* through a contact hole passing through the interlayer insulating layer ILD and the buffer layer BFL. Furthermore, the third power conductive layer PL2*c* may be electrically connected to the second power conductive layer PL2*b* through a contact hole passing through the interlayer insulating layer ILD. The third power conductive layer PL2*c* along with the first power conductive layer PL2*a* and/or the second power conductive layer PL2*b* may form the second power line PL2 described with reference to FIG. 8 or the like.

The first and second transistor electrodes TE1 and TE2 and the third power conductive layer PL2*c* each may have a single layer structure or a multilayer structure that is formed of molybdenum (Mo), copper (Cu), aluminum (Al), chrome (Cr), gold (Au), titanium (Ti), nickel (Ni), neodymium (Nd), indium (In), tin (Sn), and/or an oxide or alloy thereof. A passivation layer PSV may be disposed on the first and second transistor electrodes TE1 and TE2 and the third power conductive layer PL2*c*. The passivation layer PSV may be formed of a single layer or multiple layers, and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and/or titanium oxide ($TiO_x$).

A via layer VIA may be disposed on the passivation layer PSV. The via layer VIA may be formed of organic material for planarizing a stepped structure formed thereunder. For example, the via layer VIA may include organic material such as acrylic resin, epoxy resin, phenolic resin, polyamide resin, polyimide resin, polyester resin, polyphenylene sulfide resin, and/or benzocyclobutene (BCB). However, the disclosure is not limited thereto. The via layer VIA may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and/or titanium oxide ($TiO_x$).

The partition walls WL may be disposed on the via layer VIA. The partition walls WL may function to form a certain stepped structure to allow the light emitting elements LD to be readily easily aligned in the emission area EA.

Depending on embodiments, the partition walls WL may have various shapes. In an embodiment, the partition walls WL may have a shape protruding from the base layer BSL in the third direction (the Z-axis direction). Furthermore, the partition walls WL each may have an inclined surface which is inclined at a certain angle with respect to the base layer BSL. However, the disclosure is not limited thereto. The partition walls WL each may have a sidewall having a curved or stepped shape. For example, the partition walls WL each may have a cross-sectional shape such as a semi-circular or semi-elliptical shape.

The partition walls WL may include at least one organic material and/or inorganic material. For example, the partition walls WL each may include organic material such as acrylic resin, epoxy resin, phenolic resin, polyamide resin, polyimide resin, polyester resin, polyphenylene sulfide resin, and/or benzocyclobutene (BCB). However, the disclosure is not limited thereto. The partition walls WL each may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and/or titanium oxide ($TiO_x$).

The electrodes ALE may be disposed on the via layer VIA and the partition walls WL. The electrodes ALE may at least partially cover sidewalls and/or upper surfaces of the partition walls WL. The electrodes ALE that are disposed over the partition walls WL may have shapes corresponding to the partition walls WL. For example, the electrodes ALE that are disposed on the partition walls WL may include inclined surfaces or curved surfaces having shapes corresponding to those of the partition walls WL. The partition walls WL and the electrodes ALE may function as reflectors, and reflect light emitted from the light emitting elements LD and guide the light in the frontal direction of the pixel PXL, i.e., in the third direction (the Z-axis direction), whereby the light output efficiency of the display panel PNL may be enhanced.

The electrodes ALE may be disposed at positions spaced apart from each other. The electrodes ALE may be disposed on the same layer. For example, the electrodes ALE may be simultaneously formed through the same process, but the disclosure is not limited thereto.

The electrodes ALE may be supplied with alignment signals at the step of aligning the light emitting elements LD. Therefore, an electric field may be formed between the electrodes ALE, so that the light emitting elements LD that are provided in each of the pixels PXL may be aligned between the electrodes ALE.

The electrodes ALE may include at least one conductive material. For example, the electrodes ALE may include at least one conductive material among at least one metal of various metal materials including silver (Ag), magnesium (Mg), aluminum (Al), platinum (Pt), palladium (Pd), gold (Au), nickel (Ni), neodymium (Nd), iridium (Ir), chrome (Cr), titanium (Ti), molybdenum (Mo), copper (Cu), etc., or an alloy thereof, conductive oxide such as indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and a conductive polymer such as PEDOT, but the disclosure is not limited thereto.

The first electrode ALE1 may be electrically connected to the first transistor electrode TE1 of the transistor M through a contact hole passing through the via layer VIA and the passivation layer PSV. The second electrode ALE2 may be electrically connected to the third power conductive layer PL2*c* through a contact hole passing through the via layer VIA and the passivation layer PSV.

A first insulating layer INS1 may be disposed on the electrodes ALE. The first insulating layer INS1 may be formed of a single layer or multiple layers, and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and/or titanium oxide ($TiO_x$).

The first bank BNK1 may be disposed on the first insulating layer INS1. The first bank BNK1 may include an opening that overlaps the emission area EA. The opening of the first bank BNK1 may provide, at the step of supplying the light emitting elements LD to each pixel PXL, space to which the light emitting elements LD are to be provided. For example, a desired kind and/or amount of light emitting element ink may be supplied to the space defined by the opening of the first bank BNK1.

The first bank BNK1 may include organic material such as acrylic resin, epoxy resin, phenolic resin, polyamide resin, polyimide resin, polyester resin, polyphenylene sulfide resin, and/or benzocyclobutene (BCB). However, the disclosure is not limited thereto. The first bank BNK1 may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and/or titanium oxide ($TiO_x$).

The light emitting elements LD may be disposed between the electrodes ALE. The light emitting elements LD may be biasedly aligned between the electrodes ALE. For example, the light emitting elements LD may be biasedly aligned such that the first end EP1 (or the first semiconductor layer) thereof overlaps the first electrode ALE1, and the second end EP2 (or the second semiconductor layer) thereof overlaps the second electrode ALE2.

The light emitting elements LD may be provided in the opening of the first bank BNK1 and disposed between the partition walls WL. The light emitting elements LD may be prepared in a diffused form in the light emitting element ink, and supplied to each of the pixels PXL by an inkjet printing scheme or the like. For example, the light emitting elements LD may be diffused in a volatile solvent and supplied to each of the pixels PXL. Thereafter, if alignment signals are supplied to the electrodes ALE, an electric field may be formed between the electrodes ALE so that the light emitting elements LD may be aligned between the electrodes ALE. As described above, in the case in which the light emitting elements LD each include an intermediate layer interposed between areas having different doping concentrations, the dipole moment can remain high by controlling movement of electrons in the operation of aligning the light emitting elements LD, so that the alignment of the light emitting elements LD can be enhanced. After the light emitting elements LD have been aligned, the solvent may be removed by a volatilization scheme or other schemes. In this way, the light emitting elements LD may be reliably arranged between the electrodes ALE.

A second insulating layer INS2 may be disposed on the light emitting elements LD. For example, the second insulating layer INS2 may be partially provided on the light emitting elements LD so that the first and second ends EP1 and EP2 of the light emitting elements LD are exposed from the second insulating layer INS2. In case that the second insulating layer INS2 is formed on the light emitting elements LD after the alignment of the light emitting elements LD have been completed, the light emitting elements LD may be prevented from being removed from the aligned positions.

The second insulating layer INS2 may be formed of a single layer or multiple layers, and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and/or titanium oxide ($TiO_x$).

The connection electrodes ELT may be disposed on the first and second ends EP1 and EP2 of the light emitting elements LD that are exposed from the second insulating layer INS2. The first connection electrode ELT1 may be directly disposed on the first ends EP1 of the first light emitting elements LD1 and contact the first ends EP1 (or the first semiconductor layer) of the first light emitting elements LD1.

Furthermore, the second connection electrode ELT2 may be directly disposed on the second ends EP2 (or the second semiconductor layer) of the first light emitting elements LD1 and contact the second ends EP2 (or the second semiconductor layer) of the first light emitting elements LD1. Furthermore, the second connection electrode ELT2 may be directly disposed on the first ends EP1 (or the first semiconductor layer) of the second light emitting elements LD2 and contact the first ends EP1 (or the first semiconductor layer) of the second light emitting elements LD2. In other words, the second connection electrode ELT2 may electrically connect the second ends EP2 (or the second semiconductor layer) of the first light emitting elements LD1 with the first ends EP1 (or the first semiconductor layer) of the second light emitting elements LD2.

Likewise, the third connection electrode ELT3 may be directly disposed on the second ends EP2 (or the second semiconductor layer) of the second light emitting elements LD2 and contact the second ends EP2 (or the second semiconductor layer) of the second light emitting elements LD2. Furthermore, the third connection electrode ELT3 may be directly disposed on the first ends EP1 (or the first semiconductor layer) of the third light emitting elements LD3 and contact the first ends EP1 (or the first semiconductor layer) of the third light emitting elements LD3. In other words, the third connection electrode ELT3 may electrically connect the second ends EP2 (or the second semiconductor layer) of the second light emitting elements LD2 with the first ends EP1 (or the first semiconductor layer) of the third light emitting elements LD3.

Likewise, the fourth connection electrode ELT4 may be directly disposed on the second ends EP2 (or the second semiconductor layer) of the third light emitting elements LD3 and contact the second ends EP2 (or the second semiconductor layer) of the third light emitting elements LD3. Furthermore, the fourth connection electrode ELT4 may be directly disposed on the first ends EP1 (or the first semiconductor layer) of the fourth light emitting elements LD4 and contact the first ends EP1 (or the first semiconductor layer) of the fourth light emitting elements LD4. In other words, the fourth connection electrode ELT4 may electrically connect the second ends EP2 (or the second semiconductor layer) of the third light emitting elements LD3 with the first ends EP1 (or the first semiconductor layer) of the fourth light emitting elements LD4.

Likewise, the fifth connection electrode ELT5 may be directly disposed on the second ends EP2 (or the second semiconductor layer) of the fourth light emitting elements LD4 and contact the second ends EP2 (or the second semiconductor layer) of the fourth light emitting elements LD4.

The first connection electrode ELT1 may be electrically connected to the first electrode ALE1 through a contact hole passing through the first insulating layer INS1. The fifth connection electrode ELT5 may be electrically connected to the second electrode ALE2 through a contact hole passing through the first insulating layer INS1.

In an embodiment, the connection electrodes ELT may be formed of multiple conductive layers. For example, as illustrated in FIGS. 11 and 12, the first connection electrode ELT1, the third connection electrode ELT3, and the fifth connection electrode ELT5 may be disposed on the same layer. Furthermore, the second connection electrode ELT2 and the fourth connection electrode ELT4 may be disposed on the same layer. The first connection electrode ELT1, the third connection electrode ELT3, and the fifth connection electrode ELT5 may be disposed on the second insulating layer INS2. A third insulating layer INS3 may be disposed on the first connection electrode ELT1, the third connection electrode ELT3, and the fifth connection electrode ELT5. The second connection electrode ELT2 and the fourth connection electrode ELT4 may be disposed on the third insulating layer INS3.

As such, in case that the third insulating layer INS3 is disposed between the connection electrodes ELT that are formed of different conductive layers, the connection electrodes ELT may be reliably separated from each other by the third insulating layer INS3, so that electrical stability between the first and second ends EP1 and EP2 of the light emitting elements LD can be secured.

The third insulating layer INS3 may be formed of a single layer or multiple layers, and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and/or titanium oxide ($TiO_x$).

In an embodiment, the connection electrodes ELT may be formed of the same conductive layer. For example, as illustrated in FIGS. 13 and 14, the first to fifth connection electrodes ELT1, ELT2, ELT3, ELT4, and ELT5 may be formed of the same conductive layer. For instance, the first to fifth connection electrodes ELT1, ELT2, ELT3, ELT4, and ELT5 may be simultaneously formed through the same process. As such, in case that the connection electrodes ELT are simultaneously formed, the number of masks may be reduced, the fabrication process may be simplified.

The connection electrodes ELT may be formed of various transparent conductive materials. For example, the connection electrodes ELT may include at least one of various transparent conductive materials including indium tin oxide (ITO), indium zinc oxide (IZO), indium tin zinc oxide (ITZO), aluminum zinc oxide (AZO), gallium zinc oxide (GZO), zinc tin oxide (ZTO), and gallium tin oxide (GTO), and may be substantially transparent or translucent to provide satisfactory transmittance. Hence, light emitted from the first and second ends EP1 and EP2 of the light emitting elements LD may pass through the connection electrodes ELT and be emitted out of the display panel PNL.

The second bank BNK2 may be disposed on the first bank BNK1. The second bank BNK2 may be disposed in the non-emission area NEA.

The second bank BNK2 may include an opening that overlaps the emission area EA. The openings of the second bank BNK2 may provide space in which a color conversion layer, which will be described, can be provided. For example, a desired kind and/or amount of color conversion layer may be supplied to the space defined by the opening of the second bank BNK2.

The second bank BNK2 may include organic material such as acrylic resin, epoxy resin, phenolic resin, polyamide resin, polyimide resin, polyester resin, polyphenylene sulfide resin, or benzocyclobutene (BCB). However, the disclosure is not limited thereto. The second bank BNK2 may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

In an embodiment, the second bank BNK2 may include at least one light shielding and/or reflective material. Therefore, a light leakage between adjacent pixels PXL may be prevented from being caused. For example, the second bank BNK2 may include at least one black pigment.

Figure 15:
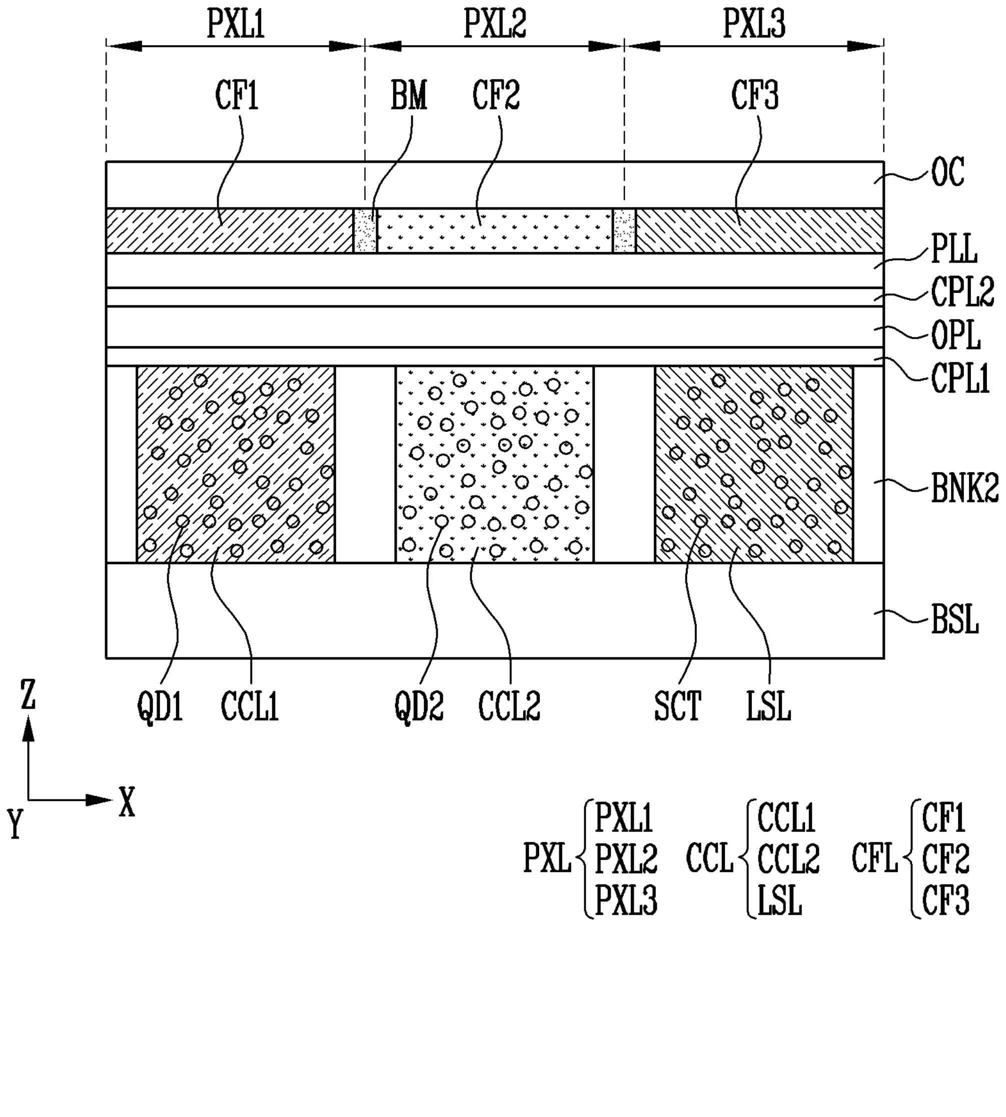
FIG. 15 is a schematic sectional view illustrating first to third pixels in accordance with an embodiment.
Figure 16:
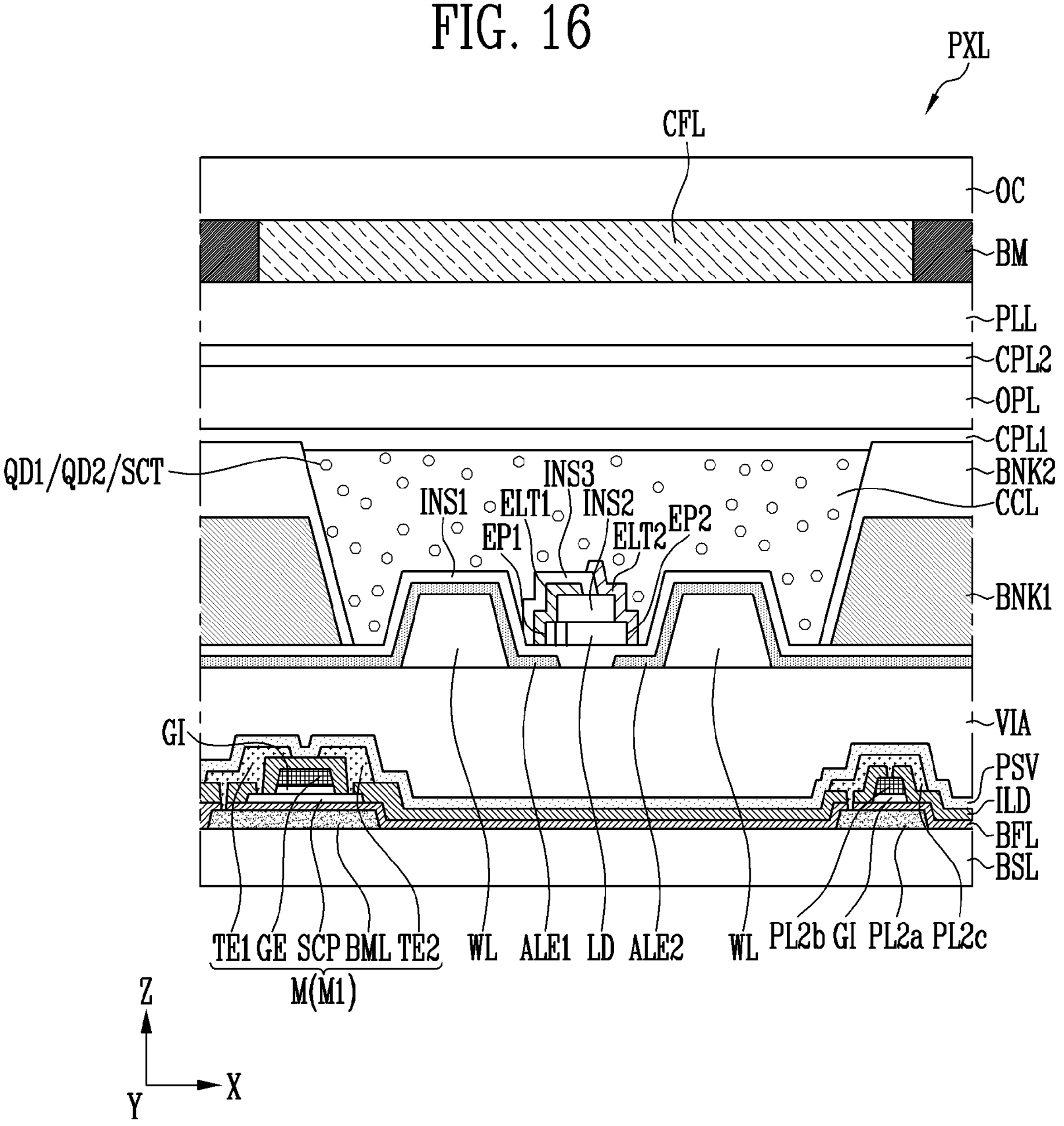
FIG. 16 is a schematic sectional view illustrating a pixel in accordance with an embodiment.

FIG. 15 is a schematic sectional view illustrating first to third pixels in accordance with an embodiment. FIG. 16 is a schematic sectional view illustrating a pixel in accordance with an embodiment.

FIG. 15 illustrates a color conversion layer CCL, an optical layer OPL, a color filter layer CFL, and/or the like. For the sake of explanation, in FIG. 15, configurations other than the base layer BSL and the second bank BNK2 of FIGS. 11 to 14 is omitted. FIG. 15 illustrates in detail a stacked structure of the pixel PXL with regard to the color conversion layer CCL, the optical layer OPL, and/or the color filter layer CFL.

Referring to FIGS. 14 and 15, the second bank BNK2 may be disposed between the first to third pixels PXL1, PXL2, and PXL3 or on boundaries therebetween, and may include openings which respectively overlap the first to third pixels PXL1, PXL2, and PXL3. The openings of the second bank BNK2 may provide space in which the color conversion layer CCL can be provided.

The color conversion layer CCL may be disposed on the light emitting elements LD in the openings of the second bank BNK2. The color conversion layer CCL may include a first color conversion layer CCL1 disposed in the first pixel PXL1, a second color conversion layer CCL2 disposed in the second pixel PXL2, and a light scattering layer LSL disposed in the third pixel PXL3.

In an embodiment, the first, second, and third pixels PXL1, PXL2, and PXL3 may include light emitting elements LD configured to emit the same color of light. In an embodiment, the first to third pixels PXL1, PXL2, and PXL3 may include light emitting elements LD configured to emit the third color of light (or blue light). Since the color conversion layer CCL including color conversion particles is disposed in each of the first to third pixels PXL1, PXL2, and PXL3, a full-color image may be displayed.

The first color conversion layer CCL1 may include first color conversion particles for converting the third color of light emitted from the light emitting element LD to the first color of light. For example, the first color conversion layer CCL1 may include multiple first quantum dots QD1 which are dispersed in a matrix material such as base resin.

In an embodiment, in case that the light emitting element LD is a blue light emitting element configured to emit blue light and the first pixel PXL1 is a red pixel, the first color conversion layer CCL1 may include the first quantum dots QD1 which convert blue light emitted from the blue light emitting element to red light. The first quantum dots QD1 may absorb blue light, shift the wavelength thereof according to an energy transition, and thus emit red light. In case that the first color pixel PXL1 is a pixel of a different color, the first color conversion layer CCL1 may include the first quantum dots QD1 corresponding to the color of the first pixel PXL1.

The second color conversion layer CCL2 may include second color conversion particles for converting the third color of light emitted from the light emitting element LD to the second color of light. For example, the second color conversion layer CCL2 may include multiple second quantum dots QD2 which are dispersed in a matrix material such as base resin.

In an embodiment, in case that the light emitting element LD is a blue light emitting element configured to emit blue light and the second pixel PXL2 is a green pixel, the second color conversion layer CCL2 may include the second quantum dots QD2 which convert blue light emitted from the blue light emitting element to green light. The second quantum dots QD2 may absorb blue light, shift the wavelength thereof according to an energy transition, and thus emit green light. In case that the second color pixel PXL2 is a pixel of a different color, the second color conversion layer CCL2 may include the second quantum dots QD2 corresponding to the color of the second pixel PXL2.

In an embodiment, as blue light having a relatively short wavelength in a visible ray area is incident on each of the first quantum dots QD1 and the second quantum dots QD2, absorption coefficients of the first quantum dot QD1 and the second quantum dot QD2 may be increased. Therefore, eventually, the efficiency of light emitted from the first pixel PXL1 and the second pixel PXL2 may be enhanced, and satisfactory color reproducibility may be secured. Furthermore, since emission components EMU for the first to third pixels PXL1, PXL2, and PXL3 are formed of light emitting elements LD (e.g., blue light emitting elements) configured to emit the same color of light, the efficiency of the process of fabricating the display device may be enhanced.

The light scattering layer LSL may be provided to efficiently use the third color of light (or blue light) emitted from the light emitting element LD. For example, in case that the light emitting element LD is a blue light emitting element configured to emit blue light and the third pixel PXL3 is a blue pixel, the light scattering layer LSL may include at least one type of light scatterers SCT to efficiently use light emitted from the light emitting element LD. For example, the light scatterers SCT of the light scattering layer LSL may include at least one of barium sulfate ($BaSO_4$), calcium carbonate ($CaCO_3$), titanium oxide ($TiO_2$), silicon oxide ($SiO_2$), aluminum oxide ($Al_2O_3$), zirconium oxide ($ZrO_2$), and zinc oxide (ZnO). The light scatterers SCT may not only be provided in the third pixel PXL3, but may also be selectively included in the first conversion layer CCL1 or the second color conversion layer CCL2. In an embodiment, the light scatterers SCT may be omitted, and the light scattering layer LSL may be formed of transparent polymer.

A first capping layer CPL1 may be disposed on the color conversion layer CCL. The first capping layer CPL1 may be provided over the first to third pixels PXL1, PXL2, and PXL3. The first capping layer CPL1 may cover the color conversion layer CCL. The first capping layer CPL1 may prevent the color conversion layer CCL from being damaged or contaminated by permeation of external impurities such as water or air.

The first capping layer CPL1 may be an inorganic layer, and be formed of silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), and/or silicon oxynitride ($SiO_xN_y$).

The optical layer OPL may be disposed on the first capping layer CPL1. The optical layer OPL may function to recycle light provided from the color conversion layer CCL by total reflection and thus enhance light extraction efficiency. Hence, the optical layer OPL may have a relatively low refractive index compared to that of the color conversion layer CCL. For example, the refractive index of the color conversion layer CCL may range from about 1.6 to about 2.0, and the refractive index of the optical layer OPL may range from about 1.1 to about 1.3.

A second capping layer CPL2 may be disposed on the optical layer OPL. The second capping layer CPL2 may be provided over the first to third pixels PXL1, PXL2, and PXL3. The second capping layer CPL2 may cover the optical layer OPL. The second capping layer CPL2 may prevent the optical layer OPL from being damaged or contaminated by permeation of external impurities such as water or air.

The second capping layer CPL2 may be an inorganic layer, and be formed of silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), and/or silicon oxynitride ($SiO_xN_y$).

A planarization layer PLL may be disposed on the second capping layer CPL2. The planarization layer PLL may be provided over the first to third pixels PXL1, PXL2, and PXL3.

The planarization layer PLL may include organic material such as acrylic resin, epoxy resin, phenolic resin, polyamide resin, polyimide resin, polyester resin, polyphenylene sulfide resin, and/or benzocyclobutene (BCB). However, the disclosure is not limited thereto. The planarization layer PLL may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and/or titanium oxide ($TiO_x$).

The color filter layer CFL may be disposed on the planarization layer PLL. The color filter layer CFL may include color filters CF1, CF2, and CF3 corresponding to the colors of the respective pixels PXL. Since the color filters CF1, CF2, and CF3 corresponding to the respective colors of the first to third pixels PXL1, PXL2, and PXL3 are disposed, a full-color image may be displayed.

The color filter layer CFL may include a first color filter CF1 disposed in the first pixel PXL1 and configured to allow light emitted from the first pixel PXL1 to selectively pass therethrough, a second color filter CF2 disposed in the second pixel PXL2 and configured to allow light emitted from the second pixel PXL2 to selectively pass therethrough, and a third color filter CF3 disposed in the third pixel PXL3 and configured to allow light emitted from the third pixel PXL3 to selectively pass therethrough.

In an embodiment, the first color filter CF1, the second color filter CF2, and the third color filter CF3 may be respectively a red color filter, a green color filter, and a blue color filter, but the disclosure is not limited thereto. Hereinafter, the term "color filter" or "color filters" will be used to designate any color filter among the first color filter CF1, the second color filter CF2, and the third color filter CF3, or collectively designate two or more kinds of color filters.

The first color filter CF1 may overlap the first color conversion layer CCL1 in the third direction (the Z-axis direction). The first color filter CF1 may include color filter material for allowing the first color of light (or red light) to selectively pass therethrough. For example, in case that the first pixel PXL1 is a red pixel, the first color filter CF1 may include red color filter material.

The second color filter CF2 may overlap the second color conversion layer CCL2 in the third direction (the Z-axis direction). The second color filter CF2 may include color filter material for allowing the second color of light (or green light) to selectively pass therethrough. For example, in case that the second pixel PXL2 is a green pixel, the second color filter CF2 may include green color filter material.

The third color filter CF3 may overlap the light scattering layer LSL in the third direction (the Z-axis direction). The third color filter CF3 may include color filter material for allowing the third color of light (or blue light) to selectively pass therethrough. For example, in case that the third pixel PXL3 is a blue pixel, the third color filter CF3 may include blue color filter material.

In an embodiment, a light shielding layer BM may be further disposed between the first to third color filters CF1, CF2, and CF3. In case that the light shielding layer BM is formed between the first to third color filters CF1, CF2, and CF3, a color mixing defect which is visible from a front surface or side surface of the display device may be prevented from occurring. The material of the light shielding layer BM is not particularly limited, and various light shielding materials may be used to form the light shielding layer BM. For example, the light shielding layer BM may be embodied by stacking the first to third color filters CF1, CF2, and CF3 one on another.

An overcoat layer OC may be disposed on the color filter layer CFL. The overcoat layer OC may be provided over the first to third pixels PXL1, PXL2, and PXL3. The overcoat layer OC may cover a lower component including the color filter layer CFL. The overcoat layer OC may prevent water or air from permeating the lower component. Furthermore, the overcoat layer OC may protect the lower component from foreign material such as dust.

The overcoat layer OC may include organic material such as acrylic resin, epoxy resin, phenolic resin, polyamide resin, polyimide resin, polyester resin, polyphenylene sulfide resin, and/or benzocyclobutene (BCB). However, the disclosure is not limited thereto. The overcoat layer OC may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

In an embodiment of the disclosure, light emitting elements each include an intermediate layer interposed between areas having different doping concentrations, so that the dipole moment of the light emitting element can be increased, whereby the alignment of the light emitting elements may be enhanced.

The effects of the disclosure are not limited by the foregoing, and other various other effects are anticipated.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure.

What is claimed is:

1. A light emitting element comprising:

a first semiconductor layer;

a second semiconductor layer including a first area, a second area, and a third area that have different doping concentrations;

an active layer disposed between the first semiconductor layer and the second semiconductor layer; and a first intermediate layer and a second intermediate layer that are disposed between at least one of the first area, the second area, and the third area, wherein the first intermediate layer and the second intermediate layer include different materials, wherein a doping concentration of the second area is greater than a doping concentration of the first area and less than a doping concentration of the third area, wherein the first area is directly disposed on the active layer, and wherein at least one of the first intermediate layer or the second intermediate layer is between the second area and the third area.

2. The light emitting element according to claim 1, wherein the first intermediate layer is disposed between the first area and the second area, and the second intermediate layer is disposed between the second area and the third area.

3. The light emitting element according to claim 1, wherein the first intermediate layer and the second intermediate layer are disposed between the second area and the third area.

4. The light emitting element according to claim 1, wherein the second area is disposed between the first area and the third area.

5. The light emitting element according to claim 1, wherein the first intermediate layer is disposed between the active layer and the second area.

6. A light emitting element comprising:

a first semiconductor layer;

a second semiconductor layer including a first area, a second area, and a third area that have different doping concentrations;

an active layer disposed between the first semiconductor layer and the second semiconductor layer; and a first intermediate layer and a second intermediate layer that are disposed between at least one of the first area, the second area, and the third area, wherein the first intermediate layer and the second intermediate layer include different materials, wherein a doping concentration of the second area is greater than a doping concentration of the first area and less than a doping concentration of the third area, wherein the first area is directly disposed on the active layer, and wherein the first intermediate layer and the second intermediate layer each include at least one of AlGaN, GaN, AlGaInN, AlN, SiN, $Si_3N_4$, and BN.

7. A display device comprising:

a first electrode and a second electrode that are spaced apart from each other; and light emitting elements disposed between the first electrode and the second electrode, wherein each of the light emitting elements comprises:

a first semiconductor layer;

a second semiconductor layer including a first area, a second area, and a third area that have different doping concentrations;

an active layer disposed between the first semiconductor layer and the second semiconductor layer; and a first intermediate layer and a second intermediate layer that are disposed between at least one of the first area, the second area, and the third area, the first intermediate layer and the second intermediate layer include different materials, wherein a doping concentration of the second area is greater than a doping concentration of the first area and less than a doping concentration of the third area, wherein the first area is directly disposed on the active layer, and wherein at least one of the first intermediate layer or the second intermediate layer is between the second area and the third area.

8. The display device according to claim 7, wherein the first electrode overlaps the first semiconductor layer, and the second electrode overlaps the second semiconductor layer.

9. The display device according to claim 8, further comprising a first connection electrode and a second connection electrode that are disposed on the light emitting elements.

10. The display device according to claim 9, wherein the first connection electrode electrically contacts the first semiconductor layer, and the second connection electrode electrically contacts the second semiconductor layer.

11. The display device according to claim 9, wherein the first connection electrode is electrically connected to the first electrode, and the second connection electrode is electrically connected to the second electrode.

12. The display device according to claim 7, wherein the first intermediate layer is disposed between the first area and the second area, and the second intermediate layer is disposed between the second area and the third area.

13. The display device according to claim 7, wherein the first intermediate layer and the second intermediate layer are disposed between the second area and the third area.

14. The display device according to claim 7, wherein the second area is disposed between the first area and the third area.

15. The display device according to claim 7, wherein the first area is disposed between the active layer and the second area.

16. A display device comprising:

a first electrode and a second electrode that are spaced apart from each other; and light emitting elements disposed between the first electrode and the second electrode, wherein each of the light emitting elements comprises:

a first semiconductor layer;

a second semiconductor layer including a first area, a second area, and a third area that have different doping concentrations;

an active layer disposed between the first semiconductor layer and the second semiconductor layer; and a first intermediate layer and a second intermediate layer that are disposed between at least one of the first area, the second area, and the third area, the first intermediate layer and the second intermediate layer include different materials, wherein a doping concentration of the second area is greater than a doping concentration of the first area and less than a doping concentration of the third area, wherein the first area is directly disposed on the active layer, and wherein the first intermediate layer and the second intermediate layer each include at least one of AlGaN, GaN, AlGaInN, AlN, SiN, $Si_3N_4$, and BN.

* * * * *